(12) United States Patent
Liu et al.

(10) Patent No.: US 12,616,037 B2
(45) Date of Patent: Apr. 28, 2026

(54) SUBSTRATE PROCESSING AND PACKAGING

(71) Applicant: TEXAS INSTRUMENTS INCORPORATED, Dallas, TX (US)

(72) Inventors: Jane Qian Liu, Plano, TX (US);
Bradley Morgan Haskett, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/394,178

(22) Filed: Dec. 22, 2023

(65) Prior Publication Data

US 2024/0128199 A1     Apr. 18, 2024

Related U.S. Application Data

(62) Division of application No. 17/081,611, filed on Oct. 27, 2020, now Pat. No. 11,894,313.

(51) Int. Cl.
| | |
|---|---|
| *H01L 23/544* | (2006.01) |
| *H01L 21/302* | (2006.01) |
| *H01L 21/78* | (2006.01) |
| *H01L 23/00* | (2006.01) |
| *H01L 23/498* | (2006.01) |

(52) U.S. Cl.
CPC .......... *H01L 23/544* (2013.01); *H01L 21/302* (2013.01); *H01L 21/78* (2013.01); *H01L 23/49838* (2013.01); *H01L 24/05* (2013.01); *H01L 2224/04042* (2013.01)

(58) Field of Classification Search
CPC ..... H01L 23/544; H01L 21/302; H01L 21/78; H01L 23/49838; H01L 24/05; H01L 2224/04042; H01L 21/4857; H01L 23/5384; H01L 24/32; H01L 24/48; H01L 24/97; H01L 24/45; H01L 24/73; H01L 24/83; H01L 24/85; H01L 24/92; H01L 2221/68331; H01L 2221/68345; H01L 2224/2919; H01L 2224/32225; H01L 2224/45124; H01L 2224/45139; H01L 2224/45144; H01L 2224/45147; H01L 2224/48227; H01L 2224/48228; H01L 2224/48463; H01L 2224/4847; H01L 2224/73265; H01L 2224/8385; H01L 2224/85444; H01L 2224/8592; H01L 2224/92247; H01L 2224/97; H01L 2924/15159; H01L 2924/15787; H01L 2924/18165; H01L 21/6835
See application file for complete search history.

(56) References Cited

U.S. PATENT DOCUMENTS

| | | | |
|---|---|---|---|
| 9,068,279 B2 | 6/2015 | Jiunn-Yih | |
| 9,391,028 B1 * | 7/2016 | Chen .................. | H01L 21/6835 |
| 2003/0173575 A1 | 9/2003 | Eisert | |
| 2005/0017258 A1 | 1/2005 | Fehrer | |

(Continued)

*Primary Examiner* — Thanh T Nguyen
(74) *Attorney, Agent, or Firm* — Michael T. Gabrik; Frank D. Cimino

(57) ABSTRACT

An example ceramic panel has a first surface and a second surface. The ceramic panel has a bond finger well on the first surface of the ceramic panel a scribe line well on the second surface of the ceramic panel. The ceramic panel also has a scribe line along the scribe line well.

18 Claims, 13 Drawing Sheets

(56)          References Cited

U.S. PATENT DOCUMENTS

| 2005/0042805 | A1 * | 2/2005 | Swenson | ................ | B23K 26/40 |
| | | | | | 438/460 |
| 2013/0049195 | A1 * | 2/2013 | Wu | ....................... | H01L 21/561 |
| | | | | | 257/738 |
| 2015/0029725 | A1 * | 1/2015 | Kamikawa | ................ | F21V 7/24 |
| | | | | | 362/296.04 |
| 2018/0331005 | A1 | 11/2018 | Fukuchi | | |

* cited by examiner

*100*

| | |
|---|---|
| 102 | PRODUCE A CERAMIC PANEL CONTAINING SCRIBE LINES ALONG SCRIBE LINE WELLS |
| 104 | PACKAGE DIE |
| 106 | SINGULATE THE CERAMIC PANEL ALONG THE SCRIBE LINES ALONG THE SCRIBE LINE WELLS |

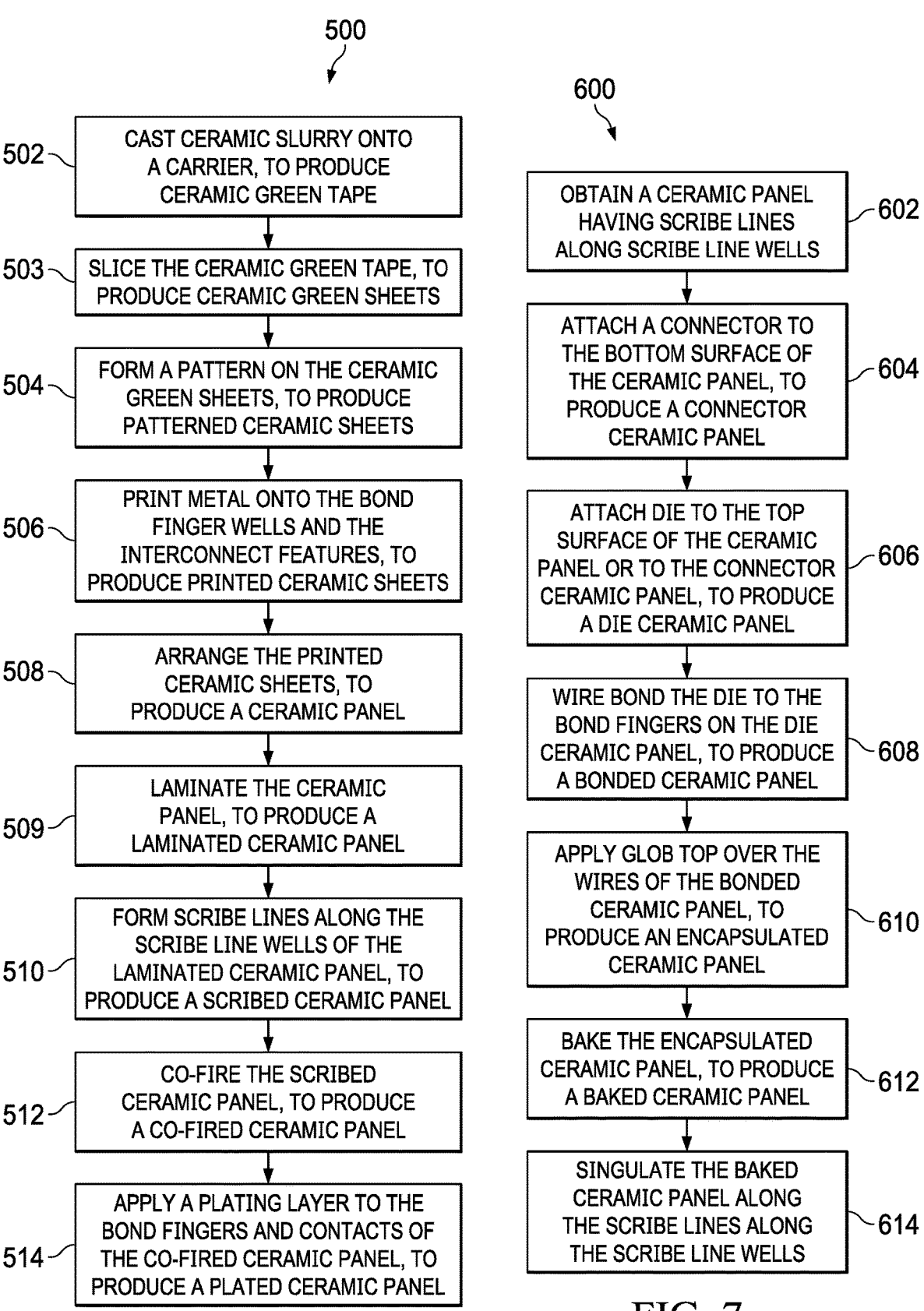

500

502 — CAST CERAMIC SLURRY ONTO A CARRIER, TO PRODUCE CERAMIC GREEN TAPE

503 — SLICE THE CERAMIC GREEN TAPE, TO PRODUCE CERAMIC GREEN SHEETS

504 — FORM A PATTERN ON THE CERAMIC GREEN SHEETS, TO PRODUCE PATTERNED CERAMIC SHEETS

506 — PRINT METAL ONTO THE BOND FINGER WELLS AND THE INTERCONNECT FEATURES, TO PRODUCE PRINTED CERAMIC SHEETS

508 — ARRANGE THE PRINTED CERAMIC SHEETS, TO PRODUCE A CERAMIC PANEL

509 — LAMINATE THE CERAMIC PANEL, TO PRODUCE A LAMINATED CERAMIC PANEL

510 — FORM SCRIBE LINES ALONG THE SCRIBE LINE WELLS OF THE LAMINATED CERAMIC PANEL, TO PRODUCE A SCRIBED CERAMIC PANEL

512 — CO-FIRE THE SCRIBED CERAMIC PANEL, TO PRODUCE A CO-FIRED CERAMIC PANEL

514 — APPLY A PLATING LAYER TO THE BOND FINGERS AND CONTACTS OF THE CO-FIRED CERAMIC PANEL, TO PRODUCE A PLATED CERAMIC PANEL

OBTAIN A CERAMIC PANEL HAVING SCRIBE LINES ALONG SCRIBE LINE WELLS — 602

ATTACH A CONNECTOR TO THE BOTTOM SURFACE OF THE CERAMIC PANEL, TO PRODUCE A CONNECTOR CERAMIC PANEL — 604

ATTACH DIE TO THE TOP SURFACE OF THE CERAMIC PANEL OR TO THE CONNECTOR CERAMIC PANEL, TO PRODUCE A DIE CERAMIC PANEL — 606

WIRE BOND THE DIE TO THE BOND FINGERS ON THE DIE CERAMIC PANEL, TO PRODUCE A BONDED CERAMIC PANEL — 608

APPLY GLOB TOP OVER THE WIRES OF THE BONDED CERAMIC PANEL, TO PRODUCE AN ENCAPSULATED CERAMIC PANEL — 610

BAKE THE ENCAPSULATED CERAMIC PANEL, TO PRODUCE A BAKED CERAMIC PANEL — 612

SINGULATE THE BAKED CERAMIC PANEL ALONG THE SCRIBE LINES ALONG THE SCRIBE LINE WELLS — 614

FIG. 7

SUBSTRATE PROCESSING AND PACKAGING

The present application is a Divisional of U.S. patent application Ser. No. 17/081,611 filed on Oct. 27, 2020, which application is hereby incorporated herein in its entirety.

BACKGROUND

Substrate scribing may cause premature breakage or damage during substrate singulation. Long or deep scribe lines may cause premature breakage during substrate handling, for example by tools or cassettes, by hand, or during transportation. On the other hand, short or shallow scribe lines may lead to substrates that are hard to singulate, leading to device failures, substrate burrs, or substrate cracks caused by singulation. Also, deep scribe lines may partially heal themselves, making them shallower. It is desirable to singulate substrates with a low yield loss from premature breakage or damage during singulation.

SUMMARY

An example ceramic panel has a first surface and a second surface. The ceramic panel has a bond finger well on the first surface of the ceramic panel a scribe line well on the second surface of the ceramic panel. The ceramic panel also has a scribe line along the scribe line well.

An example method of manufacturing an electronic device includes obtaining a ceramic panel, the ceramic panel having scribe line wells, bond fingers, and contacts and forming scribe lines along the scribe line wells of the ceramic panel, to produce a scribed ceramic panel. The method also includes applying a plating layer to the bond fingers and the contacts of the scribed ceramic panel, to produce a plated ceramic panel.

An example method of manufacturing an electronic device includes obtaining a ceramic panel having scribe lines along scribe line wells and attaching a die to the ceramic panel, to produce a die ceramic panel. The method also includes singulating the die ceramic panel along the scribe lines along the scribe line wells.

BRIEF DESCRIPTION OF THE DRAWINGS

FIG. 6 shows a flow chart of an example method of substrate processing.

FIG. 7 shows a flow chart of an example method of packaging.

DETAILED DESCRIPTION

Substrates, such as ceramic substrates, may be singulated to separate devices. Ceramic panels may prematurely break when scribe lines are long and/or deep. Premature breakage, for example broken panels or device failure, may occur during shipping or additional handling. Also, deep scribe lines may partially heal. On the other hand, ceramic panels may be difficult to singulate when scribe lines are short and/or shallow, leading to device failure, singulation burrs, or singulation chips.

Thick ceramic panels may be especially difficult to singulate cleanly without prematurely breaking. Thick ceramic panels facilitate stable structures and adequate internal routing. Thick ceramic panels may have a thickness of between about 1.9 mm thick and about 2.2 mm thick. In some examples, ceramic panels are about 1.925 mm thick. In other examples, ceramic panels are thicker than 2 mm thick, for example about 2.1 mm thick or about 2.2 mm thick. In additional examples, ceramic panels are thicker than 2.2 mm.

In an example method, scribe line wells are formed in ceramic green sheets. In an example, the scribe line wells are not filled with metal. The ceramic green sheets are stacked, producing a ceramic panel having scribe line wells on at least one surface. In an example, the scribe line wells are formed on both the top surface and the bottom surface of the ceramic panel. In another example, the scribe line wells are only formed on the bottom of the ceramic panel. In an additional example, the scribe line wells are buried.

In an example, scribe lines are formed along the scribe line wells. In another example, scribe lines are not formed. Also, the ceramic panel is singulated along the scribe lines along the scribe line wells. In an example, the lengths of the scribe line wells span the majority of the length of the ceramic panel along the scribe line. Forming the scribe lines along the scribe line wells reduces the depth that the scribe line extends through into the ceramic material below the bottom of the scribe line well, while maintaining or increasing the total depth that the scribe line extends beneath the top surface of the ceramic panel without increasing the risk of the scribe line healing, because the scribe line begins at the bottom of the scribe line well. Shallower scribe lines are easier to control and less susceptible to healing. Accordingly, the ceramic panel with scribe lines along scribe line wells is easier to singulate cleanly without prematurely breaking. An example method increases device yield at a low financial cost, because scribe line wells are formed in the same step in which other ceramic features are formed.

Figure 1:
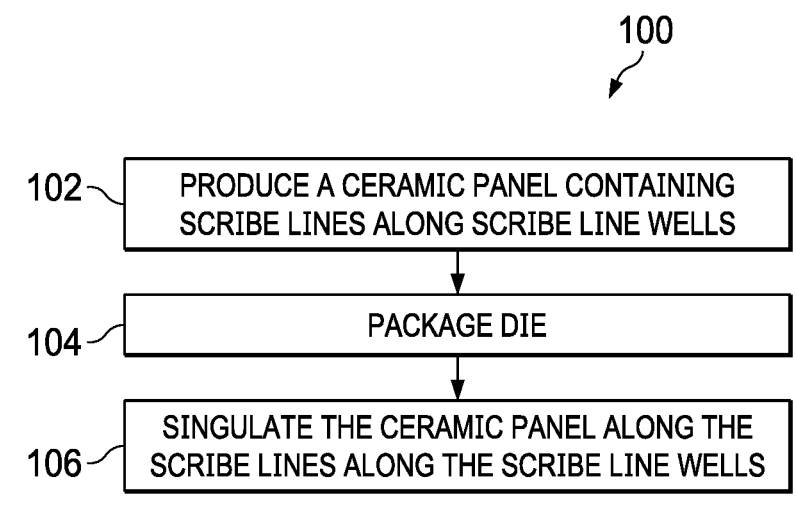
FIG. 1 shows a flow chart of an example method of substrate processing and packaging.

FIG. 1 shows a flow chart 100 of an example method of substrate processing and packaging. In a block 102, a ceramic panel containing scribe lines along scribe line wells is produced. A tape caster forms ceramic slurry into ceramic green sheets. While the ceramic green sheets are soft, a punching machine forms a pattern in the ceramic green sheets, producing patterned ceramic sheets. Using, for example, a multi-pin punching tool, the punching machine forms scribe line wells, bond finger wells, registration features, and interconnect features, such as vias, in the ceramic green sheets. A stacker stacks the patterned ceramic sheets, producing a ceramic panel. The ceramic panel may have scribe line wells on a top surface of the ceramic panel, on a bottom surface of the ceramic panel, or on both the top surface and the bottom surface of the ceramic panel. In an example, the scribe line wells are not filled with metal. A tool forms scribe lines along the scribe line wells. In an example, the combined lengths of the scribe line wells span the majority of the length of the scribe lines. The ceramic green sheets are stacked by a stacker, producing a ceramic panel having scribe line wells on at least one surface. Forming the scribe lines along the scribe line wells reduces the depth that the scribe line extends through the ceramic material below the bottom of the scribe line wells while maintaining or increasing the total depth that the scribe line extends beneath the top surface of the ceramic panel. That is, because the scribe line begins at the bottom of the scribe line well, lower than the top surface of the ceramic panel, the depth that the scribe line extends into the material can be less, reducing the risk of rehealing, while having a greater distance between the top surface of the ceramic material and the bottom of the scribe line.

In a block 104, the die are packaged. A tool attaches die to the top surface of the ceramic panel from the block 102. In an example, the scribe line wells are in frame patterns around the die. A tool wire bonds the die to bond fingers in bond finger wells of the ceramic panel. Also, a tool applies glob top over the wires. In some examples, a soldering tool attaches a connector to the bottom surface of the ceramic panel. In other examples, a connector is not attached.

In a block 106, the ceramic panel is singulated along the scribe lines along the scribe line wells. The ceramic panel is singulated on four sides of a device. Singulating the ceramic panel along the scribe lines along the scribe line wells makes the ceramic panel easier to singulate, reducing device loss due to singulation burrs, singulation cracks, and device failure, increasing yield.

Figure 2A:
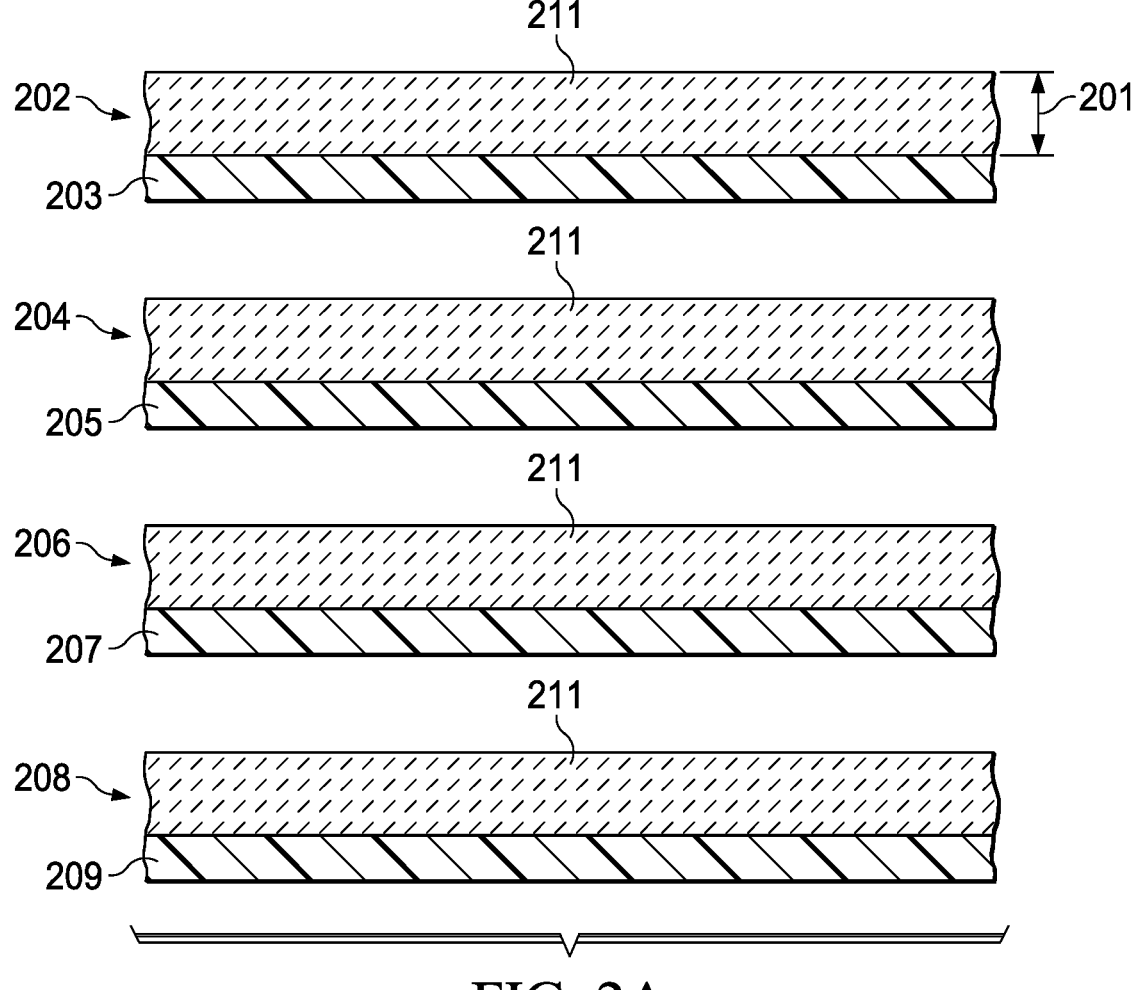
FIGS. 2A-K show cross section side views of an example method of substrate processing and packaging.

FIGS. 2A-K show cross section side views of an example method of substrate processing and packaging. FIGS. 2A-K may show the blocks 102-106 of the flow chart 100 shown in FIG. 1. FIG. 2A shows cross section side views of ceramic green sheets 202, 204, 206, and 208 with ceramic material 211 on carriers 203, 205, 207, and 209. Ceramic slurry is cast, to produce ceramic green tape on a carrier. A green ceramic is a ceramic that has not yet been fired, and it is soft and weak. The ceramic slurry contains ceramic material dissolved in a solvent, mixed with plasticizers and/or binders. In an example, the ceramic material is alumina (aluminum oxide). In other examples, the ceramic material is another ceramic material, such as another oxide, for example zirconia. The ceramic green tape is dried. Also, the ceramic green tape is sliced into segments, to produce the ceramic green sheets 202, 204, 206, and 208 on the carriers 203, 205, 207, and 209, respectively. The ceramic material 211 of ceramic green sheet 202 may have a thickness 201 of between about 0.2 mm thick and about 0.3 mm thick. In another example (not shown) there is no carrier under the ceramic green sheets.

Figure 2B:
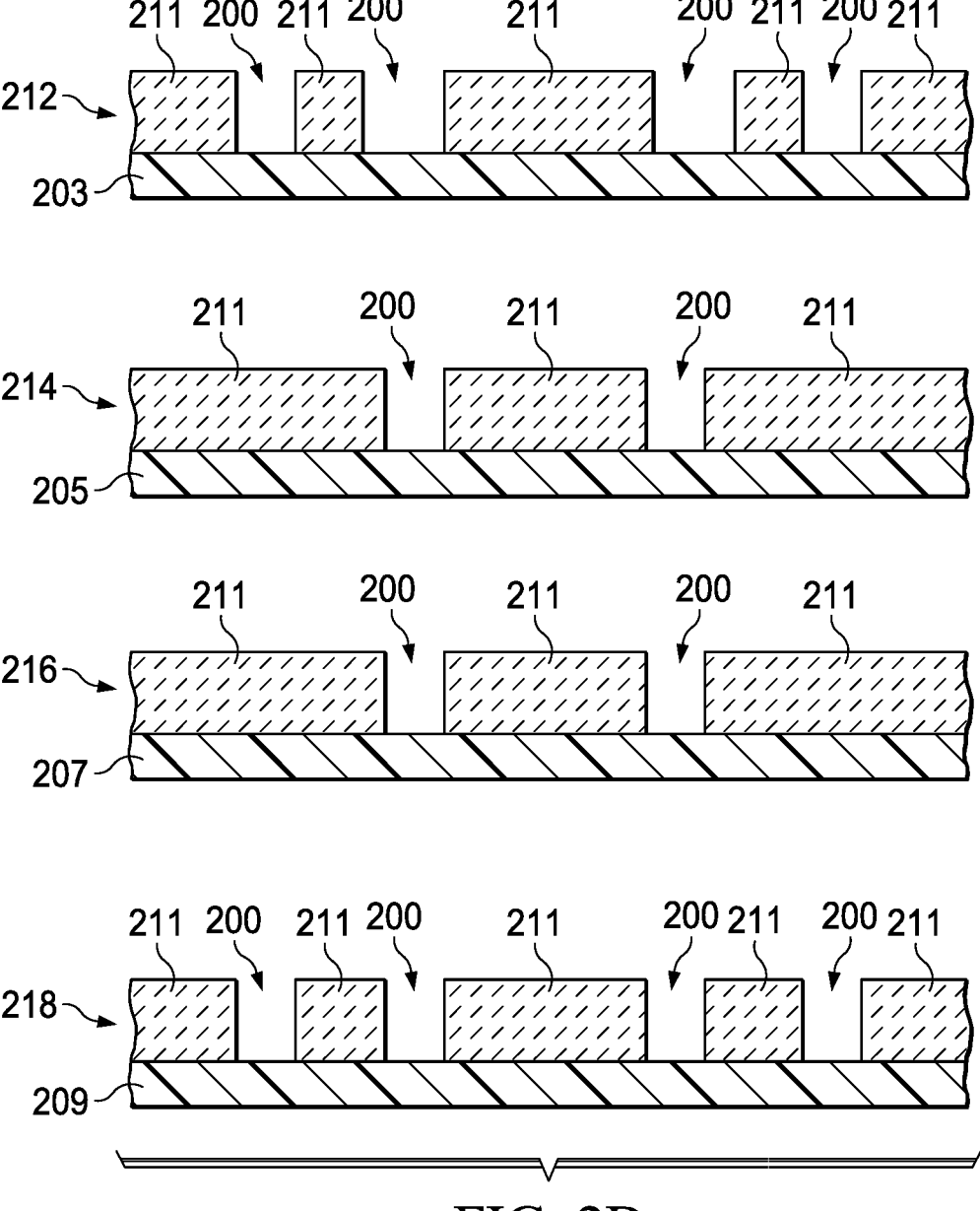

In FIG. 2B, features 200 are formed in the ceramic material 211, producing patterned ceramic sheets 212, 214, 216, and 218. The features 200 may be formed by a punching machine using a multi-pin punching tool to punch the features 200, which may be scribe line wells, bond finger wells, interconnect features, vias for electrical connections between layers, datum holes or notches for mechanical registration into the system, corner holes, and/or registration holes. In an example, a single multi-pin punching tool (not shown) is used to punch the scribe line wells and bond finger wells simultaneously in the ceramic green sheets 202, 204, 206, and 208 with one punching step per ceramic green sheet. In some examples, multiple punching steps, for example using different multi-pin punching tools or multiple single-pin punching tools, are performed. In an example, a first multi-pin punching tool (not shown) punches scribe line wells in the ceramic green sheets 202, 204, 206, and 208 in a first punching step per ceramic green sheet and a second multi-pin punching tool (not shown) punches other features in the ceramic green sheets 202, 204, 206, and 208 in a second punching step per ceramic green sheet.

Figure 2C:
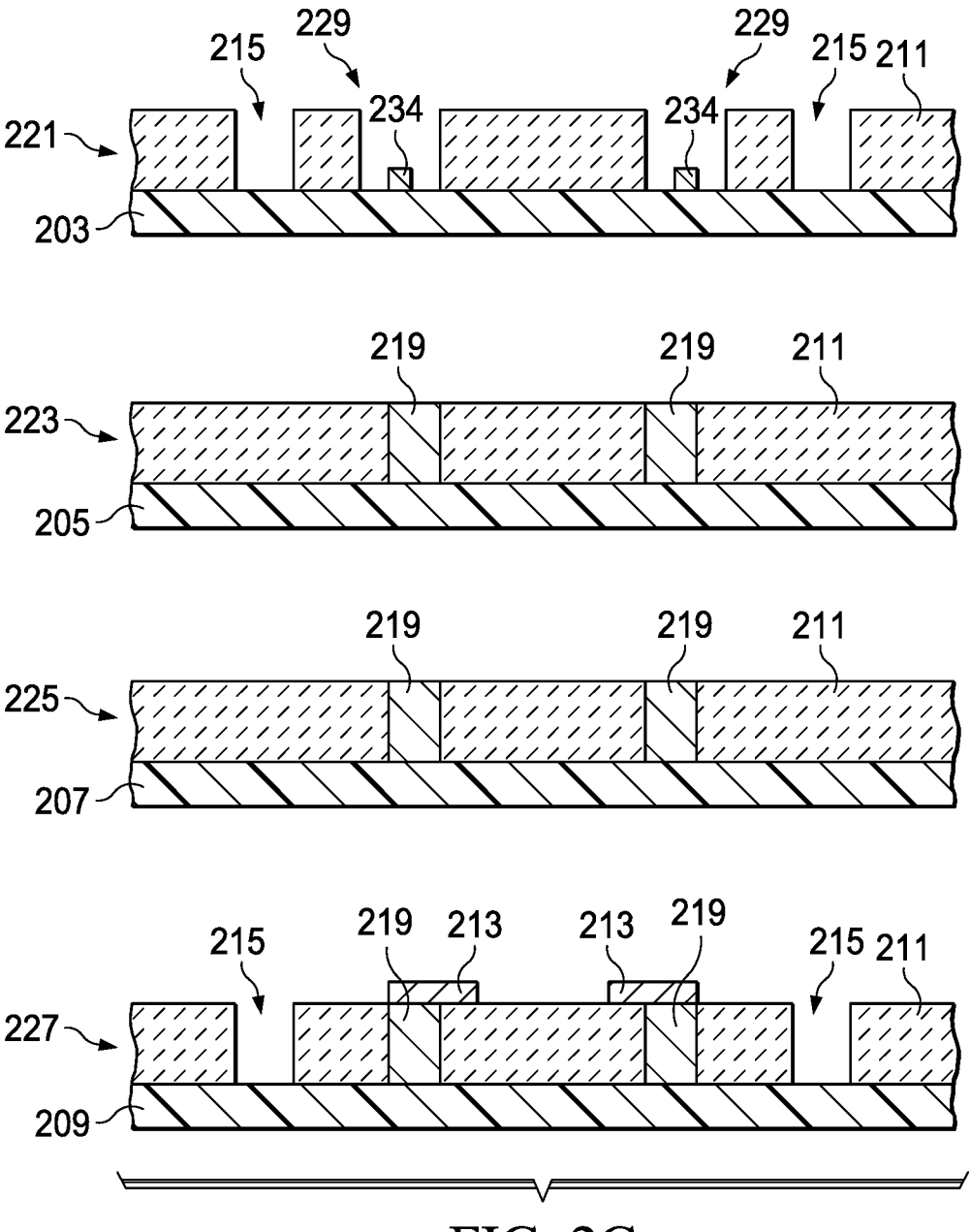

In FIG. 2C, metal is printed onto the patterned ceramic sheets 212, 214, 216, and 218, to produce printed ceramic sheet 221, 223, 225, and 227, respectively. In an example, metal is not printed in scribe line wells 215, for example by screen printing. In another example, a small amount of metal is printed in the scribe line wells 215, but the scribe line wells 215 are only filled with a small amount of metal. For example, the scribe line wells 215 are less than 10% filled with metal, or less than 2% filled with metal. The printed ceramic sheet 221 has bond fingers 234 in bond finger wells 229, the printed ceramic sheets 223, 225, and 227 have interconnect features 219, and the printed ceramic sheet 227 has contacts 213. Lateral connections between the vertical vias are made by traces which are screen printed onto the internal layers (not shown). In an example, the metal is a tungsten based ink. In addition to or instead of printing, via filling may apply metal to some or all of the interconnect features 219.

Figure 2D:
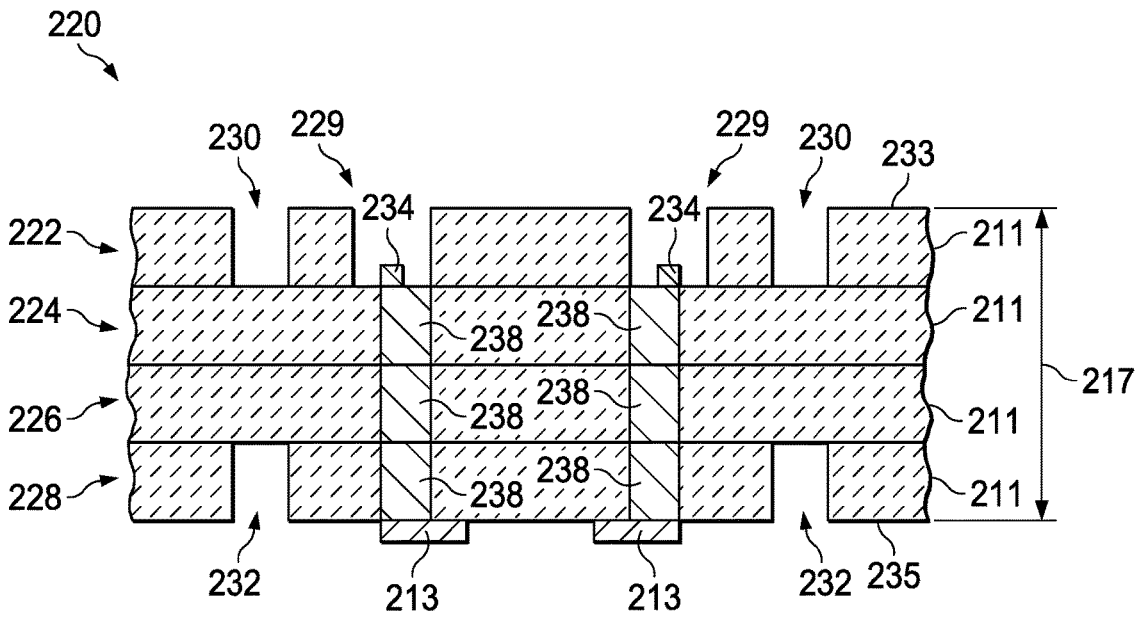

In FIG. 2D, the printed ceramic sheet 227 is flipped, and the printed ceramic sheets 221, 223, 225, and 227 are stacked, producing a ceramic panel 220. The printed ceramic sheets 221, 223, 225, and 227 form ceramic layers 222, 224, 226, and 228, respectively. The registration holes (not shown) are used to align the printed ceramic sheets 221, 223, 225, and 227. In the shown example, the carriers 203, 205, 207, and 209 are removed before the printed ceramic sheets 221, 223, 225, and 227 are stacked. In other examples, the carriers are removed in a later step, for example by burning off during co-firing. In additional examples, a carrier is not used, and is therefore not removed. The ceramic layer 222 has bond fingers 234 in bond finger wells 229, and also has scribe line wells 230. Additionally, the ceramic layer 228 has contacts 213 and scribe line wells 232. The ceramic layers 224, 226, and 228 have interconnect features 238. The ceramic panel 220 has a top surface 233 and a bottom surface 235. As shown, the scribe line wells 230 and 232 are one ceramic layer deep, but in other examples, the scribe line wells are multiple ceramic layers deep, for example two or three ceramic layers deep. Scribe line wells are shown on both the top surface 233 and the bottom surface 235 of the ceramic panel 220, but scribe line wells may be present only on the top surface 233 or only on the bottom surface 235. Four ceramic layers in the ceramic panel 220 are shown, but more ceramic layers, for example 5, 6, 7, 8, 9, 10, or more ceramic layers, each ceramic layer corresponding to a printed ceramic sheet, may be used. The ceramic panel 220 may have a thickness 217 of between about 1.9 mm thick and about 2.2 mm thick. In some examples, the thickness 217 of the ceramic panel 220 is about 1.925 mm thick. In other examples, the thickness 217 of the ceramic panel 220 is thicker than 2 mm thick, for example about 2.1 mm thick or about 2.2 mm thick. In additional examples, the thickness 217 of the ceramic panel 220 is thicker than 2.2 mm thick. After stacking, the ceramic panel 220 is laminated by isostatic pressing. The ceramic layers 222, 224, 226, and 228 are pressed together.

Figure 2E:
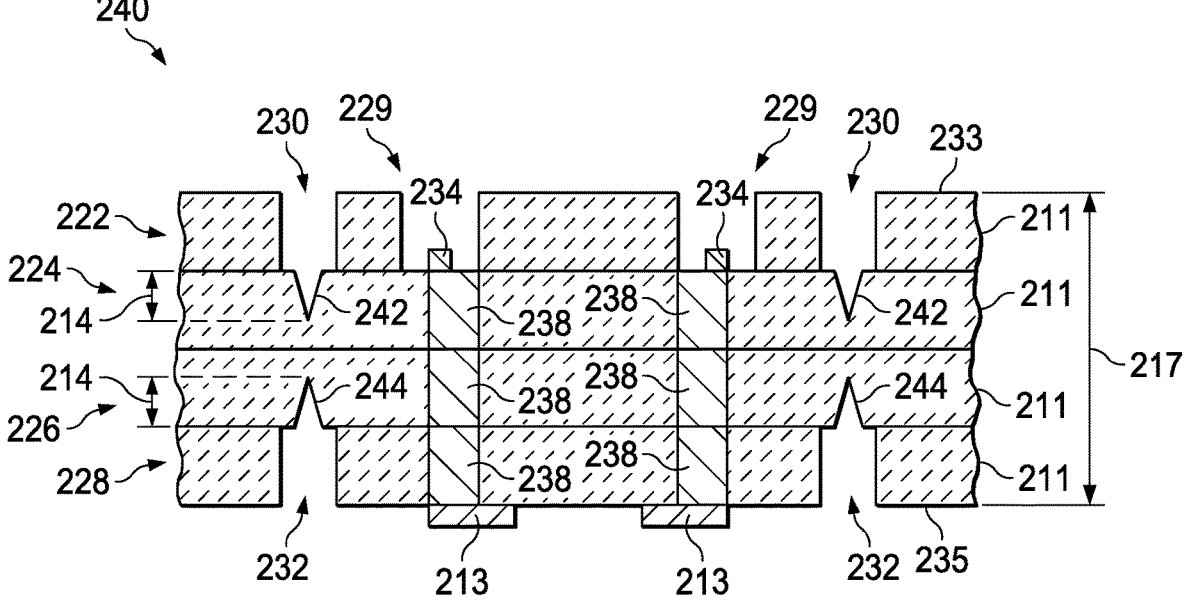

In FIG. 2E, scribe lines 242 are formed along the scribe line wells 230 and scribe lines 244 are formed along the scribe line wells 232, producing a ceramic panel 240. In an example, the scribe lines are formed by long razor blades (not shown) being pushed straight down into the ceramic material 211. The scribe lines 242 and 244 are shown as less than a ceramic layer deep, but they may be deeper than a ceramic layer. In an example, the scribe lines 242 and 244 have depths 241 of between about 0.32 mm and about 0.88 mm, for example about 0.78 mm. In other examples, the scribe lines 242 and 244 have depths 241 of greater than 0.88 mm Forming the scribe lines 242 and 244 along the scribe line wells 230 and 232 makes singulation easier, or maintains the ease of singulation while the scribe lines extend less far through the ceramic material below the bottom of the scribe line well. Also, shallower scribe lines are easier to control, with less rehealing. In an example (not pictured) scribe lines are not formed along the scribe line wells 230 and the scribe line wells 232.

The ceramic panel 240 is co-fired. Low temperature co-firing is performed below about 1000 degrees Celsius, while high temperature co-firing is performed at about 1600 degrees Celsius. In co-firing, the ceramic material 211 of the ceramic layers 222, 224, 226, and 228 sinters together. In some examples, where the carrier has not previously been removed, the carrier burns off during co-firing. After co-firing, the ceramic panel is no longer green.

Figure 2F:
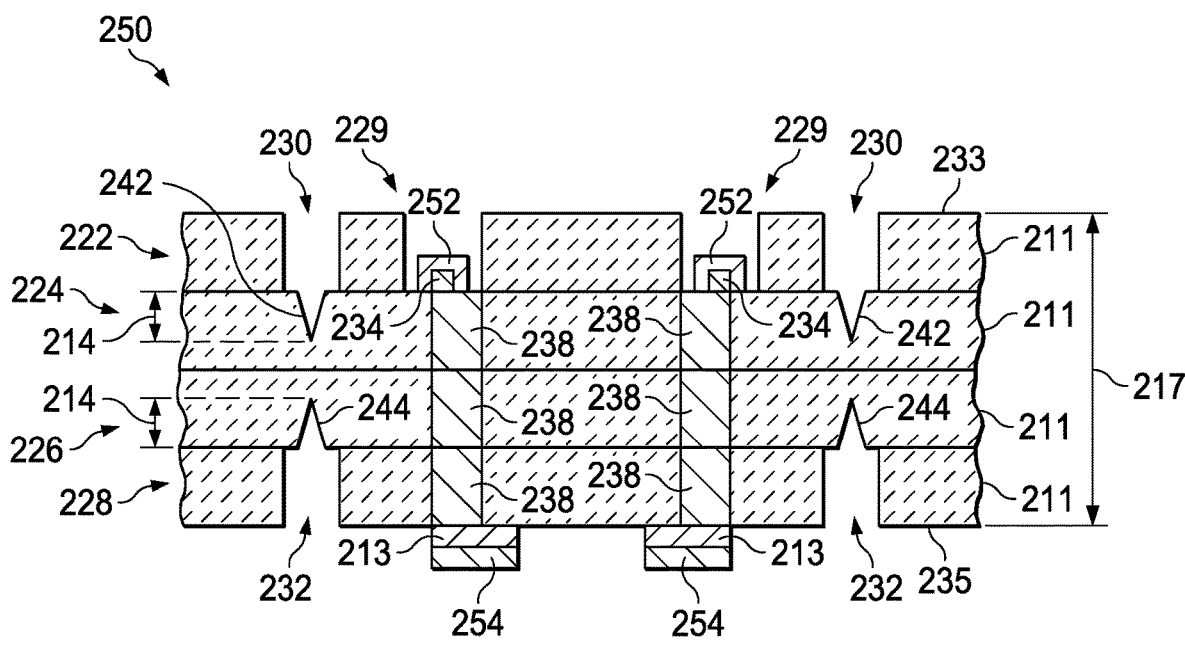

In FIG. 2F, a plating layer 252 is applied to the bond fingers 234, and a plating layer 254 is applied to the contacts 213, producing a ceramic panel 250. In an example, a layer of nickel is applied by a plating machine (not shown). Then, the same plating machine or a different plating machine (not shown) applies a layer of gold to the layer of nickel. Sputtering, electroless plating, electroplating, or another method may be used by the plating machine to perform plating. In an example (not shown) pin grid array (PGA) pins are applied to the contacts 213 through the plating layer 254. Then, another nickel and gold plating step is performed on the PGA pins.

Figure 2G:
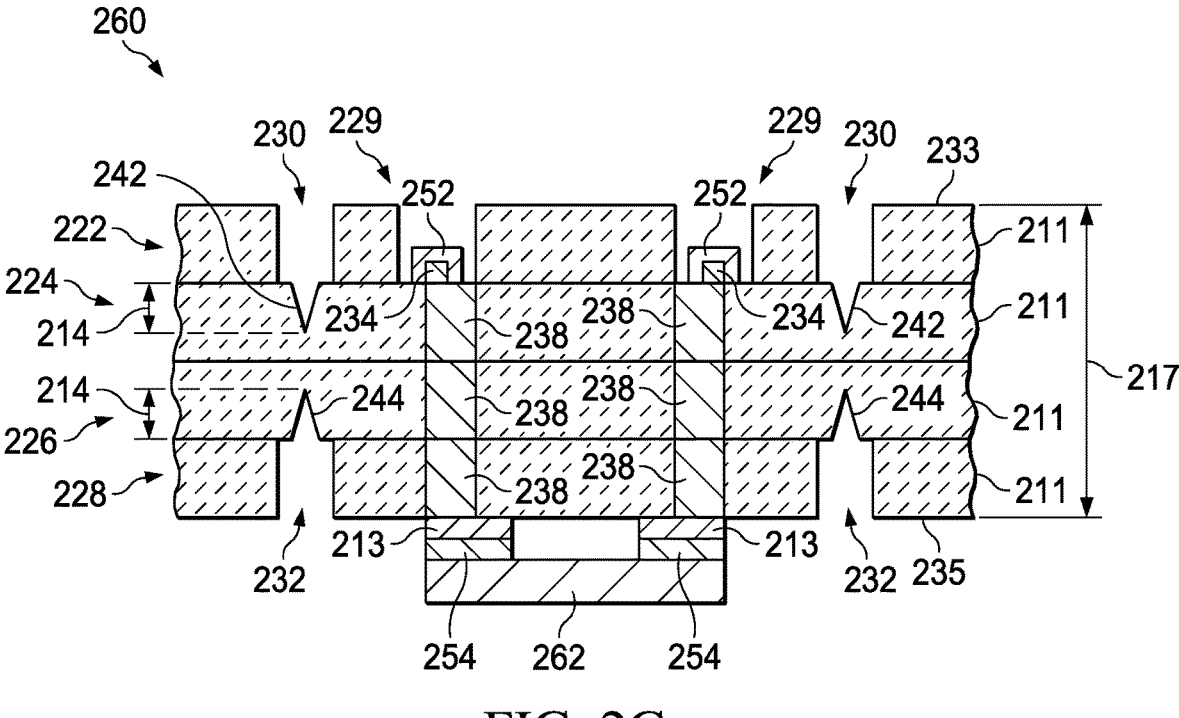

In FIG. 2G, a connector 262 is attached, for example by surface-mount soldering, to the plating layer 254 on the contacts 213 on the bottom surface 235 of the ceramic panel 250, producing a ceramic panel 260. In some examples (not shown), for example when land grid array (LGA) pads or PGA pins are used, a connector is not attached to the bottom surface 235 of the ceramic panel.

Figure 2H:
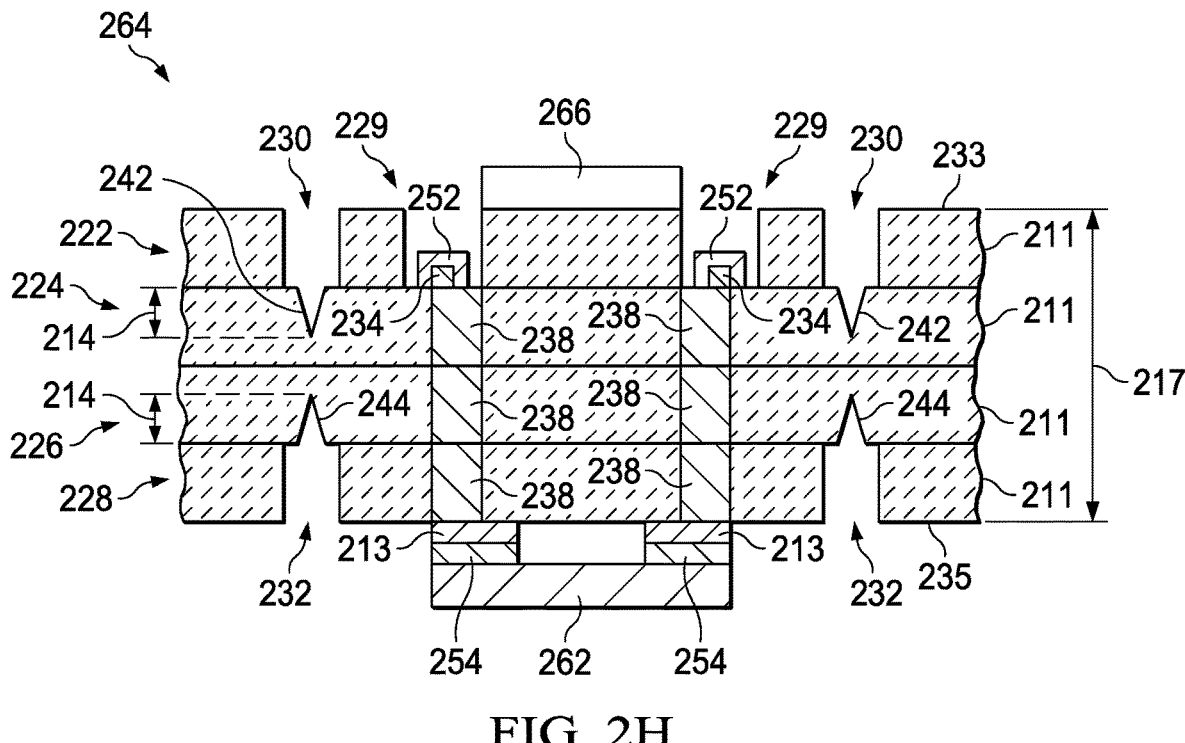

In FIG. 2H, die 266 is attached to the top surface 233 of the ceramic panel 260 or of the ceramic panel 250, producing a ceramic panel 264. In an example, epoxy (not shown) is used to attach the die 266. The die 266 may contain a spatial light mirror, such as a digital micromirror device (DMD).

Figure 2I:
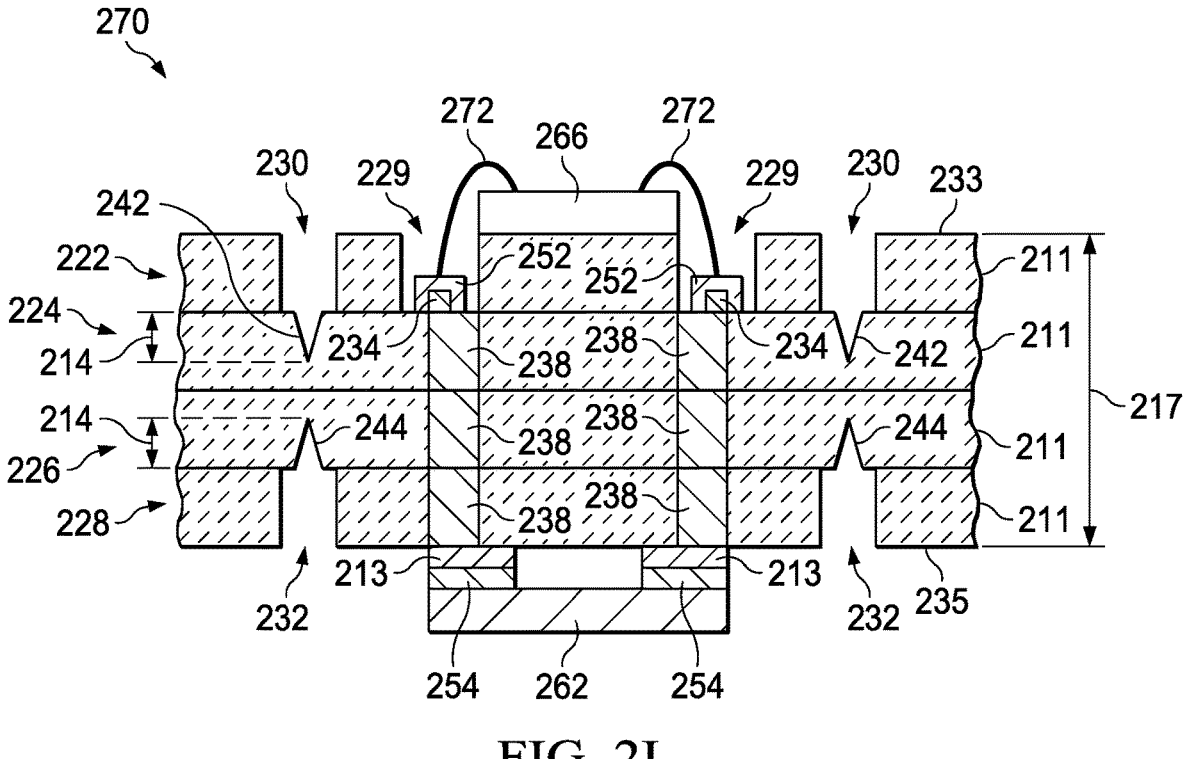

In FIG. 2I, the die 266 is wire bonded, with wires 272, to the top surface 233 of the ceramic panel 264 by the plating layer 252 on the bond fingers 234, producing a ceramic panel 270. The wires 272 may contain aluminum, copper, silver, and/or gold. The wire bonding may be performed using ball bonding, wedge bonding, or compliant bonding.

Figure 2J:
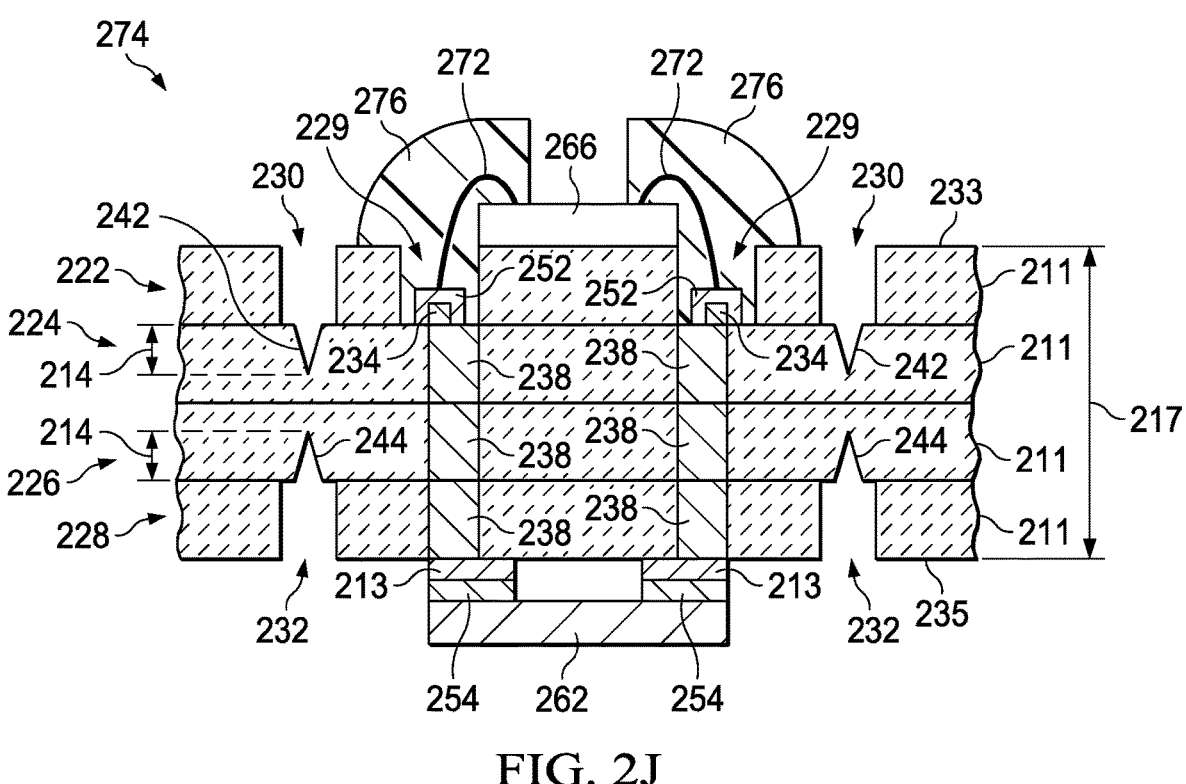

In FIG. 2J, a glob top 276 is applied over the wires 272, to produce a ceramic panel 274. The glob top 276 encapsulates and protects the wires 272. The glob top 276 may be composed of an epoxy. The glob top 276 may be a simple material hemispherical glob top (shown) or a two material dam-and-fill glob top (not shown). The ceramic panel 274 is baked to cure the glob top 276.

Figure 2K:
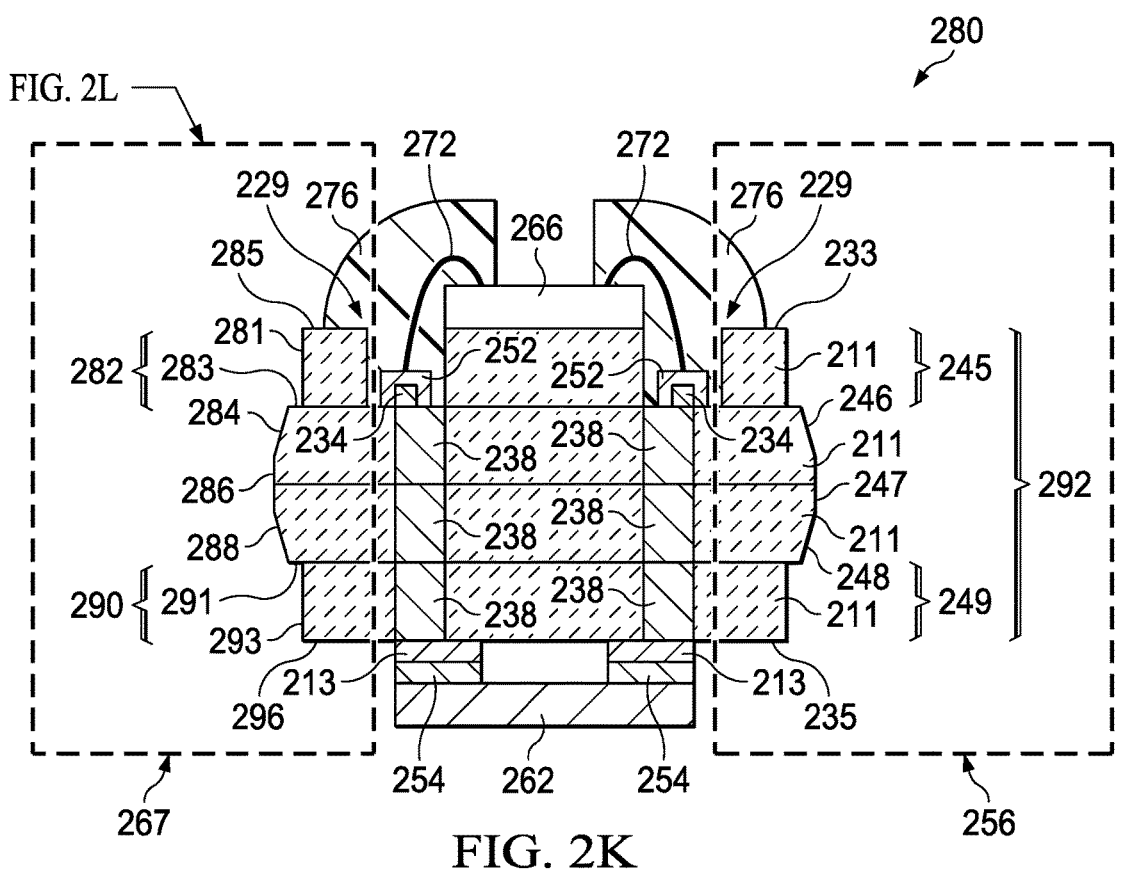

In FIG. 2K, the ceramic panel 274 is singulated, producing a device 280. In an example, the device 280 is a package, and multiple die on the ceramic panel are separated into separate packages. The ceramic panel 274 is singulated on four sides of the device 280. In another example, the device 280 is an individual substrate, and multiple die on the ceramic panel are separated into separate individual substrates. The ceramic panel 274 is held in place by a fixture (not shown), with one row of die overhanging an edge of the fixture. Another tool (not shown) is used to hold the row and push down on the row, until the row breaks away from the rest of the ceramic panel. Another fixture (not shown) holds each row, while another tool breaks away the individual die.

The die 266 is on a ceramic substrate 292. Singulating the ceramic panel 274 along the scribe lines 242 and 244 along the scribe line wells 230 and 232, respectively, makes singulation easier.

Figure 2L:
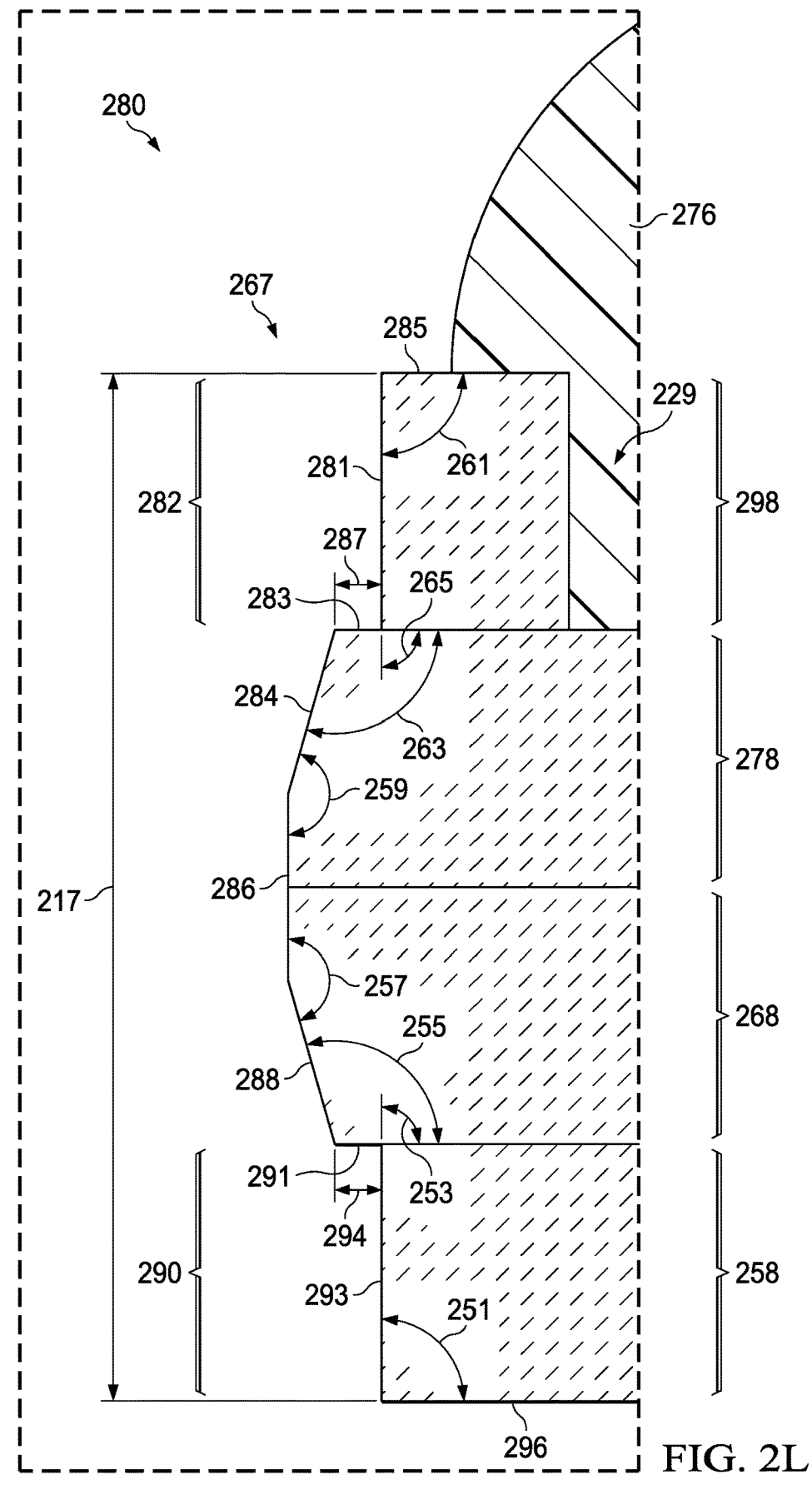
FIG. 2L shows a portion of a cross section side view of an example device.

FIG. 2L shows additional details of an edge 267 of the device 280. The device 280 has ceramic region 298, ceramic region 278, ceramic region 268, and ceramic region 258. In an example, the surface 281, the surface 283, the surface 284, the surface 286, the surface 288, the surface 291, and the surface 293 compose at least a portion of the edge 267 of the device 280. The ceramic region 298 has the surface 285 along the top and the surface 281 along the edge. The ceramic region 278 has the surface 283 along the top, the surface 284 along the edge, and a portion of the surface 286 along the edge. The ceramic region 268 has a portion of the surface 286 along the edge, the surface 288 along the edge, and the surface 291 at the bottom. The ceramic region 258 has the surface 293 along the edge and the surface 296 along the bottom. In the device 280, a notched region 282 of the ceramic substrate 292 is adjacent to the top surface 283 of the ceramic region 298. The notched region 282, containing the surface 281 and the surface 283, is formed in the ceramic region 298 by punching the green ceramic material. An angle 265 between the surface 281 and the surface 283 is, for example approximately 90 degrees. An angle 261 between the surface 281 and surface 285 is approximately 90 degrees. For example, the angle 261 is between 85 degrees and 95 degrees, for example between 89 degrees and 91 degrees. In an example, the surface 281 and the surface 283 are smooth. In an example, the surface 283 has a depth 287 of between about 0.25 mm and about 0.75 mm.

The surface 284 of the ceramic region 278, adjacent to the surface 283, is formed by scribing. The surface 284 forms a scribed region. The surface 284 may have a roughness that is greater than a roughness of the surface 281 and the surface 283, while being fairly smooth. An angle 263 between the surface 284 and the surface 283 is greater than 90 degrees, for example between about 90 degrees and about 100 degrees, for example between about 90 degrees and about 95 degrees. In another example, the angle 263 is between about 100 degrees and about 105 degrees.

A surface 286 of the ceramic region 278 and the ceramic region 268, adjacent to the surface 284, is formed by singulating the wafer. The surface 286 forms a singulated region. The surface 286 has a rough edge formed by singulation, possibly with some chips. In an example, the surface 286 has a roughness that is greater than the roughness of the surfaces 284, 283, and 281. An angle 259 between the surface 284 and the surface 286 may be slightly less than 180 degrees, for example between about 170 degrees and about 180 degrees, for example between about 175 degrees and about 180 degrees. In an example, the angle 259 is between about 165 degrees and about 170 degrees.

A surface 288 of the ceramic region 268 is adjacent to the surface 286. The surface 288 is formed by scribing, and forms a scribed region. The surface 288 may have a roughness that is less than the roughness of the surface 286, and a roughness greater than the roughness of the surfaces 281 and 283, and of a similar roughness to the roughness of the surface 284. An angle 257 between the surface 288 and the surface 286 may be slightly less than 180 degrees, for example between about 170 degrees and about 180 degrees, for example between about 175 degrees and about 180 degrees. In an example, the angle 257 is between about 165 degrees and about 170 degrees.

A notched region 290 in the ceramic region 258 containing the surface 291 and the surface 293 is between the surface 288 and surface 296. The surface 291 and the surface 293 have smooth, stepwise edges formed by punching. An angle 255 between the surface 291 and the surface 293 is approximately 90 degrees. An angle 253 between the surface 291 and the surface 293 may be approximately 90 degrees. Also, an angle 251 between the surface 293 and the surface 296 may be approximately 90 degrees. The surface 291 and the surface 293 are smooth, because they are formed by punching the green ceramic. In an example, the surface 291 has a depth 294 of between about 0.25 mm and about 0.75 mm.

FIG. 2K illustrates edge 256 on the opposite side of the device 280 relative to the edge 267. The edge 256 is similar to the edge 267. The edge 256 has a notched region 245, a scribed region 246, a singulated region 247, a scribed region 248, and a notched region 249. Two edges on opposite sides are pictured for clarity, but device 280 has four similar edges, one edge on each singulated side.

Figure 2M:
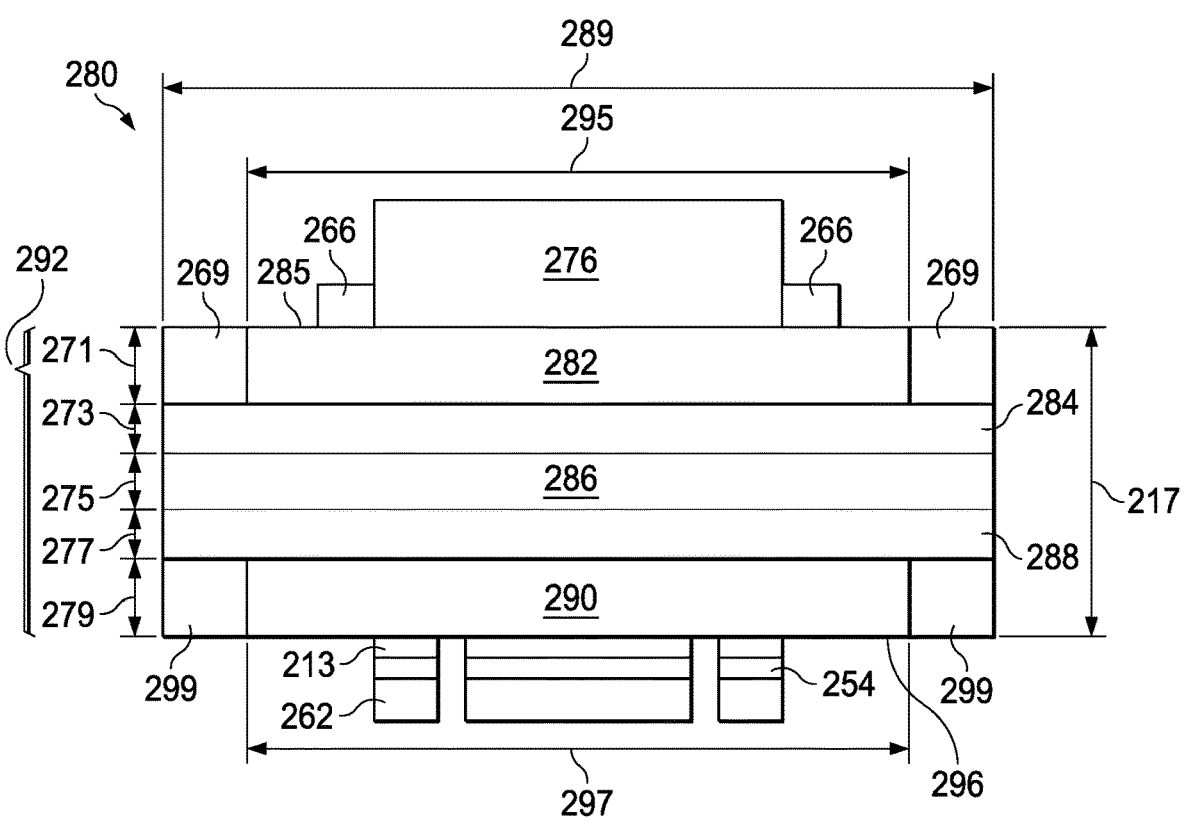
FIG. 2M shows a side view of an example device.

FIG. 2M shows an edge view of the device 280. The die 266 is disposed on the surface 285 of the ceramic substrate 292. The glob top 276 protects wires between the die 266 and the ceramic substrate 292, which are not shown for clarity. Some embodiments do not contain the glob top 276. In an example, the notched region 282 has a width 295 greater than 4.5 mm wide, for example greater than 20 mm wide. In an example, the width 295 is at least 40% the width 289 of the device 280. For example, the width 295 is at least 50% the width 289 of the device 280. For example, the width 295 is at least 60% the width 289 of the device 280. For example, the width 295 is at least 70% the width 289 of the device 280. For example, the width 295 is at least 80% the width 289 of the device 280. For example, the width 295 is at least 90% the width 289 of the device 280. For example, the width 295 is at least 90% the width 289 of the device 280. In an example, the notched region 282 has a depth 271 of between about 0.2 mm deep and about 0.4 mm deep. In an example, the notched region 282 has smooth, straight sidewalls formed by punching green ceramic material.

The surface 284 is adjacent to the notched region 282. The surface 284 forms a scribed region. In an example, the surface 284, which is formed by scribing, is rougher than the surface of the notched region 282. In an example, the surface 284 has a depth 273 of about 0.25 mm deep and about 0.35 mm deep. The surface 286 is adjacent to the surface 284. In an example, the surface 286, which is formed by singulation, is rougher than the surface 284. The surface 286 forms a singulated region. In an example, the surface 286 has a depth 275 of between about 1 mm deep and about 3 mm deep. In an example, the depth 273 is the same as the depth 275, for example between about 0.35 mm deep and about 1 mm deep. The surface 288 is adjacent to the surface 286. The surface 288 forms a scribed region. In an example, the surface 288, which is formed by scribing, has a similar amount of roughness to the surface 284, smoother than the surface 286 but rougher than the surface of the notched region 282. In an example, the surface 288 has a depth 277 of between about 0.32 mm and about 0.88 mm.

The notched region 290 is adjacent to the surface 288. In an example, the notched region 290 has a width 297 of greater than 4.5 mm wide, for example greater than 20 mm wide. In an example, the width 297 of the notched region 290 is at least 90% of the width 289 of the device 280. In an example, the notched region 290 has a depth 279 of between about 0.2 mm deep and about 0.4 mm deep. In an example, only one of the notched region 282 and the notched region 290 is present. Adjacent to the notched region 290 is the contacts 213. Adjacent to the contacts 213 is the plating layer 254. The connector 262 is adjacent to the plating layer 254.

Figure 3:
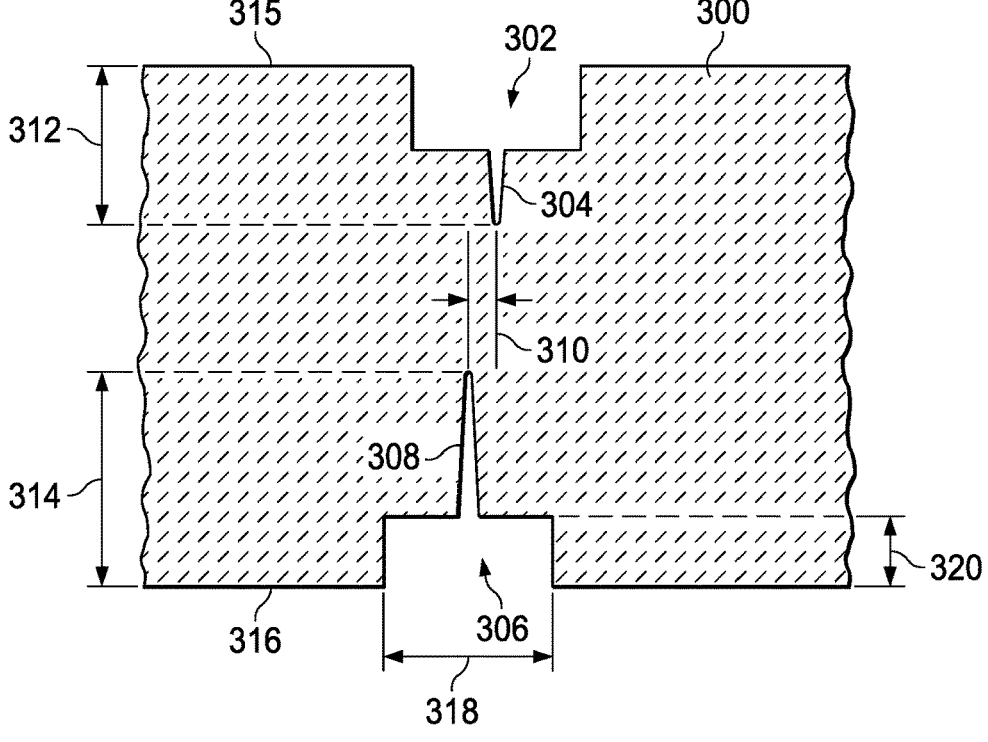
FIG. 3 shows a cross section side view of example scribe line wells and scribe lines in a substrate.

FIG. 3 shows a cross section side view of example scribe line wells and scribe lines in a ceramic panel. FIG. 3 may show, for example, the scribe lines and scribe line wells of the ceramic panel 240 in FIG. 2E. A scribe line well 302 is on a top surface 315 of a ceramic panel 300. Also, a scribe line well 306 is on a bottom surface 316 of the ceramic panel 300. The scribe line well 306 has a width 318 of between about 0.15 mm wide and about 0.5 mm wide and a depth 320 of about 0.2 mm deep. In one example, the scribe line well 302 has similar dimensions to the scribe line well 306. In another example, the scribe line well 302 has different dimensions from the scribe line well 306. In some examples, the scribe line well 306 may be deeper and/or wider than the scribe line well 302. In other examples, the scribe line well 306 is shallower and/or narrower than the scribe line well 302.

A scribe line 304 is along the scribe line well 302, and a scribe line 308 is along the scribe line well 306. The scribe line 304 and the scribe line well 302 together have a depth 312 of between about 0.3 mm deep and about 0.65 mm deep, for example about 0.55 mm deep. The scribe line 308 and the scribe line well 306 together have a depth 314 of between about 0.68 mm deep and about 1.0 mm deep, for example about 0.78 mm deep. The scribe line 304 may have an offset 310 from the scribe line 308 of less than 0.05 mm Forming the scribe lines along the scribe line wells reduces the depth that the scribe lines extend through the ceramic material below the bottom of the scribe line wells, while maintaining or increasing the total depth of the scribe line extends beneath the top surface that the ceramic panel.

Figure 4A:
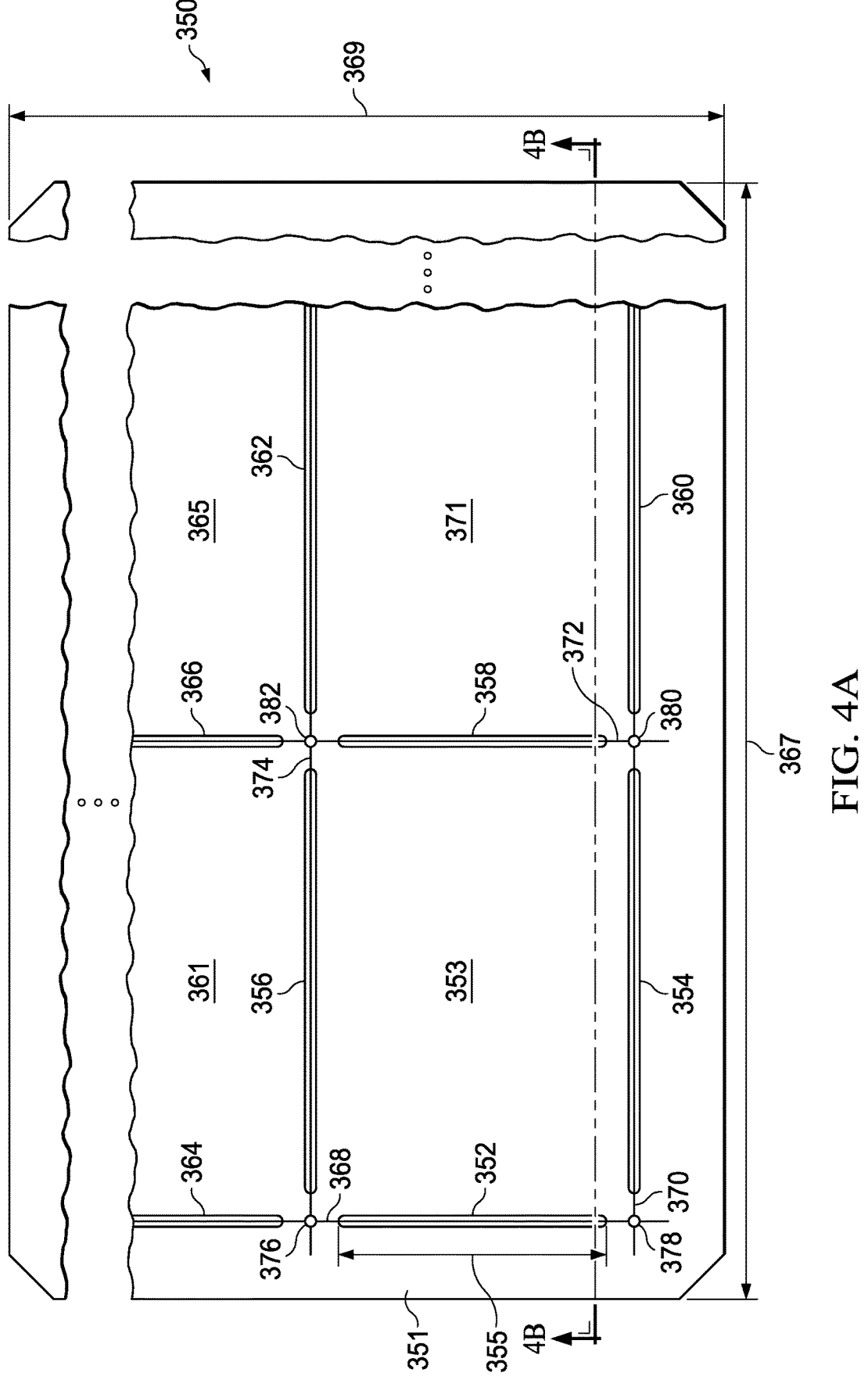
FIG. 4A shows a top view of an example ceramic panel and FIG. 4B a cross section side view of the example ceramic panel.
Figures 4B, 5B:
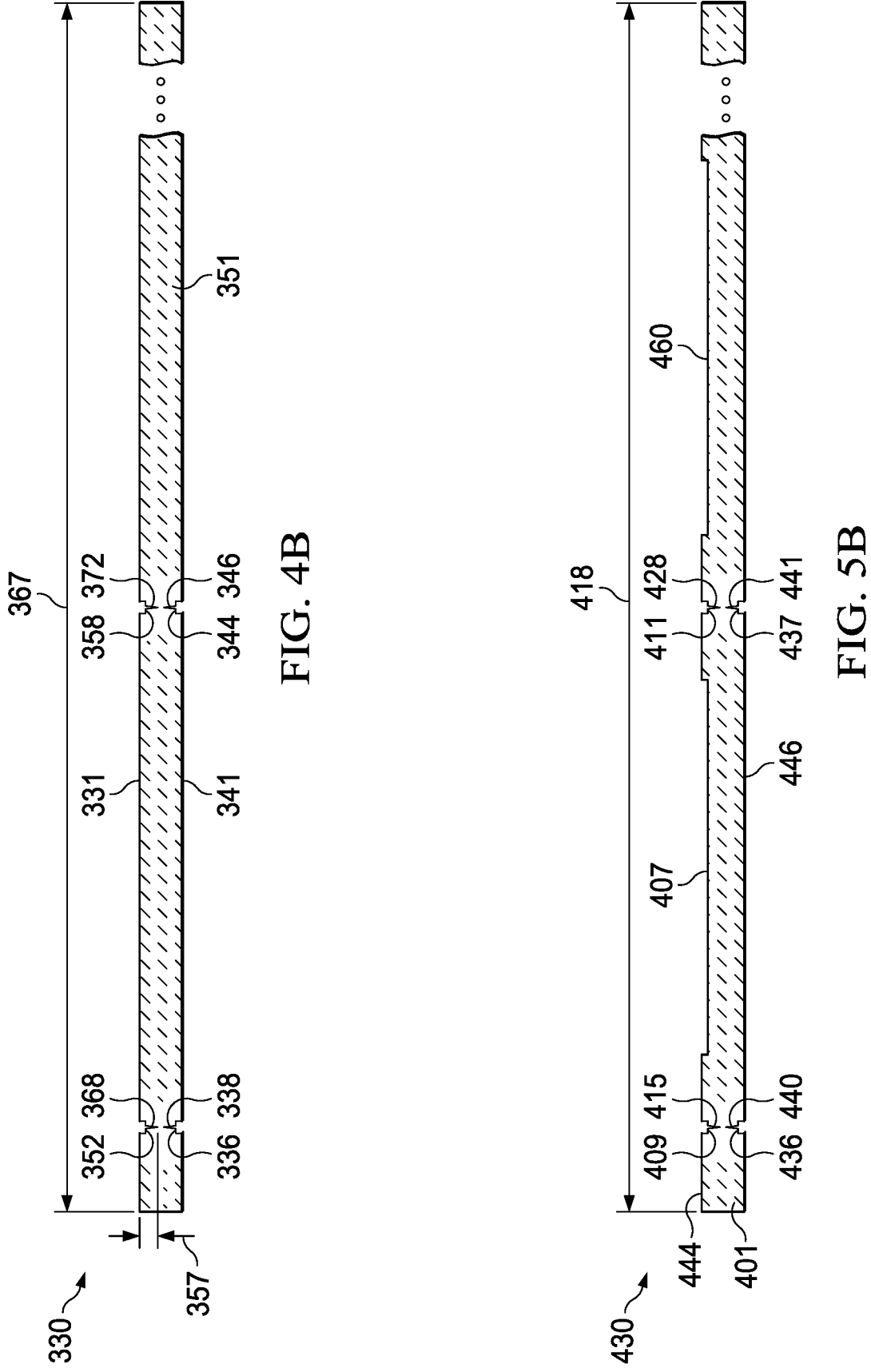
FIG. 5A shows a top view of an example ceramic panel and FIG. 5B a cross section side view of the example ceramic panel.

FIG. 4A shows a top view 350 of an example ceramic panel 351 and FIG. 4B shows a cross section side view 330 of the ceramic panel 351. The ceramic panel 351 has a width 367 and a height 369. Scribe line wells 352, 356, 358, and 354 are in a frame pattern surrounding a region 353. The scribe line well 358, a scribe line well 362, and a scribe line well 360 are in part of a frame pattern around a region 371, which is adjacent to the region 353. Also, the scribe line well 356, a scribe line well 364, and a scribe line well 366 are in part of a frame pattern around a region 361, which is adjacent to the region 353. Additionally, the scribe line well 366 and the scribe line well 362 are in part of a frame pattern around a region 365, which is adjacent to the regions 361 and 371. A scribe line 368 is along the scribe line wells 364 and 352, a scribe line 370 is along the scribe line wells 354 and 360, a scribe line 372 is along the scribe line wells 358 and 366, and a scribe line 374 is along the scribe line wells 356 and 362. The scribe lines 368 and 374 meet at a hole 376, the scribe lines 368 and 370 meet at a hole 378, the scribe lines 370 and 372 meet at a hole 380, and the scribe lines 372 and 374 meet at a hole 382 of the ceramic panel. In an example, the scribe line well 352 has a length 355 of greater than 4.5 mm, for example between about 4.5 mm and about 25 mm. In an example, the scribe line well 352 has a length 355 of greater than 20 mm, for example greater than 25 mm.

In an example, the combined length scribe line wells 352, 364, and other collinear scribe line wells (e.g. the sum of the length of the scribe line well 352, the scribe line well 364, and the other collinear scribe line wells) is at least 40% of the height 369 of the ceramic panel 351. For example, the combined length of the scribe line wells 352, 364, and other collinear scribe line wells is at least 50% of the height 369 of the ceramic panel 351. For example, the combined length of the scribe line wells 352, 364, and other collinear scribe line wells is at least 60% of the length of the height 369 of the ceramic panel 351. For example, the combined length of the scribe line wells 352, 364, and other collinear scribe line wells is at least 70% of the height 369 of the ceramic panel 351. For example, the combined length of the scribe line wells 352, 364, and other collinear scribe line wells is at least 70% of the height 369 of the ceramic panel 351. For example, the combined length of the scribe line wells 352, 364, and other collinear scribe line wells is at least 80% of the height 369 of the ceramic panel 351. For example, the combined length of the scribe line wells 352, 364, and other collinear scribe line wells is at least 90% of the height 369 of the ceramic panel 351. For example, the combined length of the scribe line wells 352, 364, and other collinear scribe line wells is at least 95% of the height 369 of the ceramic panel 351.

In an example, the combined length of the scribe line wells 354, 360, and other collinear scribe line wells is at least 40% of the width 367 of the ceramic panel 351. For example, the combined length of the scribe line wells 354, 360, and other collinear scribe line wells is at least 50% of the width 367 of the ceramic panel 351. For example, the combined length of the scribe line wells 354, 360, and other collinear scribe line wells is at least 60% of the width 367 of the ceramic panel 351. For example, the combined length of the scribe line wells 354, 360, and other collinear scribe line wells is at least 70% of the width 367 of the ceramic panel 351. For example, the combined length of the scribe line wells 354, 360, and other collinear scribe line wells is at least 80% of the width 367 of the ceramic panel 351. For example, the combined length of the scribe line wells 354, 360, and other collinear scribe line wells is at least 90% of the width 367 of the ceramic panel 351. For example, the combined length of the scribe line wells 354, 360, and other collinear scribe line wells is at least 95% of the width 367 of the ceramic panel 351.

FIG. 4B shows a cross section side view 330 of the ceramic panel 351 from the top view 350 shown in FIG. 4A along the cut line 4B. Features out of the plane of the cut line 4B are not shown for clarity. The scribe line well 352 and the scribe line well 358 are on a top surface 331 of the ceramic panel 351, and scribe line well 336 and the scribe line well 344 are on a bottom surface 341 of a ceramic panel 351. The scribe line well 336 is opposite the scribe line well 352, and the scribe line well 358 is opposite the scribe line well 344. The scribe line 368 is along the scribe line well 352, the scribe line 372 is along the scribe line well 358, a scribe line 338 is along the scribe line well 336, and a scribe line 346 is along the scribe line well 344. The scribe lines being along the scribe line wells reduces the depth that the scribe lines extend through the ceramic material below the bottom of the scribe line well while maintaining or increasing the total depth that the scribe line wells extend beneath the surface of the ceramic panel. The scribe line well 352 has a depth 357. In an example, the scribe line well 325 has an aspect ratio (e.g. the ratio of the depth 357 to the length 355) of less than 0.1, for example between about 0.01 and about 0.1. In another, the aspect ratio is less than 0.01.

Figure 5A:
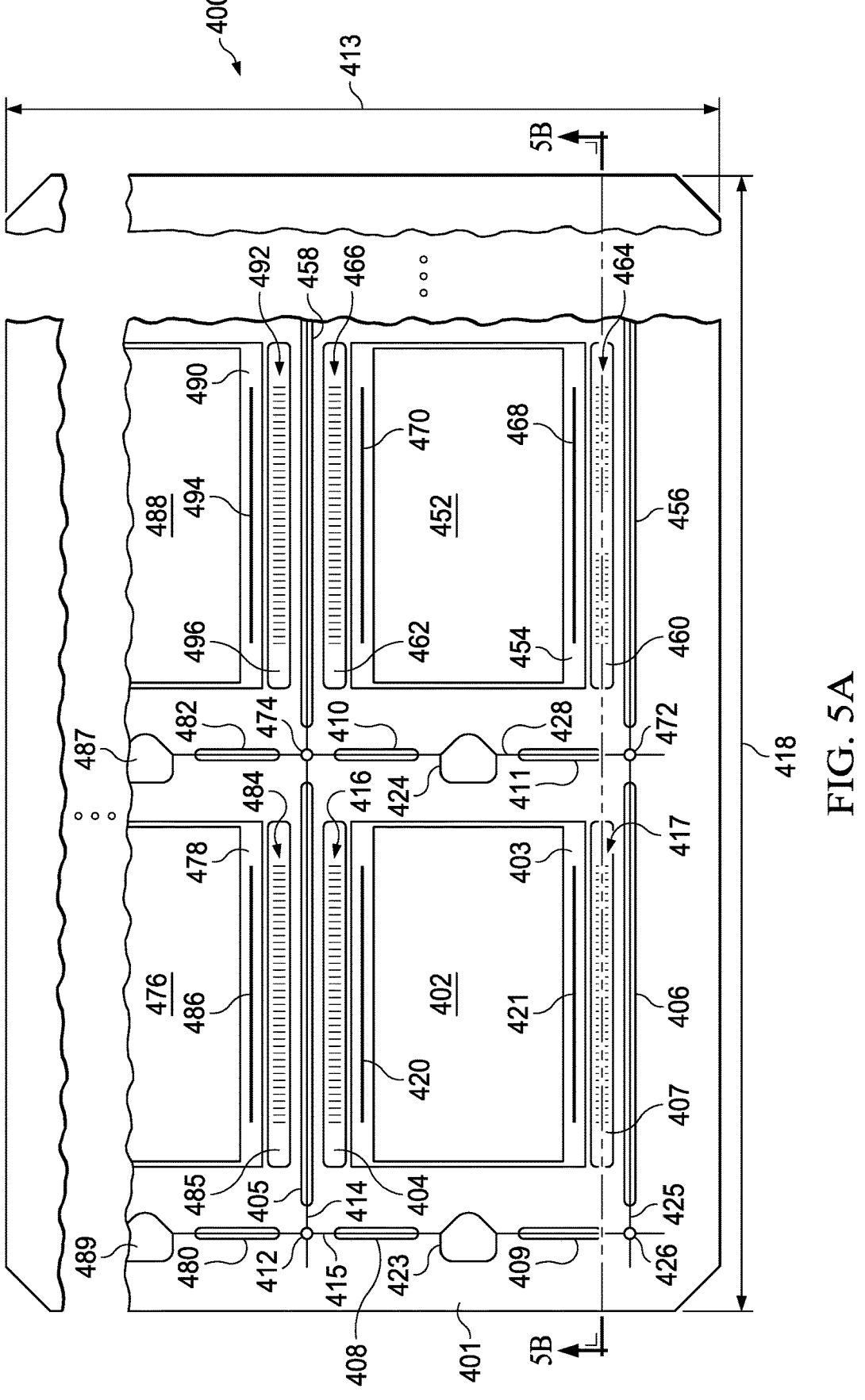

FIG. 5A shows a top view 400 of an example ceramic panel 401 and FIG. 5B a cross section side view 430 of the ceramic panel 401. The ceramic panel 401 has a width 418 and a height 413. Die 403 is adjacent to die 454 and to die 478, and catty corner with die 490, on a top surface of the ceramic panel 401. A window 402 is over most of the die

403, a window 452 is over most of the die 454, a window 476 is over most of the die 478, and a window 488 is over most of the die 490.

Scribe line wells 409, 408, 405, 410, 411, and 406 are in a frame pattern around the die 403. The scribe line wells 405 and 406 are on opposite sides of the die 403, with the scribe line well 405 between the die 403 and the die 478. In an example, the scribe line well 405 is parallel to the scribe line well 406. Parallel scribe line wells may be approximately parallel due to fabrication imperfections. The scribe line wells 408 and 409 are collinear on one side of the die 403, and the scribe line wells 410 and 411 are collinear on the opposite side of the die 403. In an example, the scribe line wells 408 and 409 are parallel the scribe line wells 410 and 411. In an example, collinear scribe line wells are approximately collinear, allowing for fabrication imperfections. As shown, an alignment notch 423 is between the scribe line well 408 and the scribe line well 409, and an alignment notch 424 is between the scribe line well 410 and the scribe line well 411. In other examples, the scribe line well 408 and the scribe line well 409 are one continuous scribe line. The die 454 is on the other side of the scribe line wells 410 and 411 and the alignment notch 424. A scribe line well 456 is along a side of the die 454. Also, a scribe line well 458 is on the opposite side of the die 454, parallel to the scribe line well 456, between the die 454 and the die 490. A scribe line well 482 and an alignment notch 487 are between the die 490 and the die 478. Also, a scribe line well 480 and an alignment notch 489 are on the opposite side of the die 478 to the scribe line well 482. The scribe line well 480 is parallel the scribe line well 482. In the shown example, the scribe line wells 406, 408, 409, 405, 410, and 411 extend past the edges of the die 403. In other examples, the scribe line wells extend to the edge of the die, or do not extend all the way to the edge of the die. In additional examples, the scribe line wells extend farther and are continuous. For example, the scribe line well 406 may be continuous with the scribe line well 456, the scribe line well 405 may be continuous with the scribe line well 458, the scribe line well 410 may be continuous with the scribe line well 482, and the scribe line well 408 may be continuous with the scribe line well 480.

A scribe line 415 is along the scribe line wells 480, 408, and 409. A scribe line 428 is along the scribe line wells 482, 410, and 411. Also, a scribe line 414 is along the scribe line wells 405 and 458. Additionally, a scribe line 425 is along the scribe line wells 406 and 456. The scribe line 414 and the scribe line 415 meet at a hole 412, the scribe line 414 and the scribe line 428 meet at a hole 474, the scribe line 415 and the scribe line 425 meet at a hole 426, and the scribe line 425 and the scribe line 428 meet at a hole 472. In an example, the combined length of scribe line wells 480, 408, 409, and other collinear scribe line wells is at least 40% of the length scribe line 428. For example, the combined length of the scribe line wells 480, 408, 409, and other collinear scribe line wells is at least 50% of the scribe line 428. For example, the combined length of the scribe line wells 480, 408, 409, and other collinear scribe line wells is at least 60% of the scribe line 428. For example, the combined length of the scribe line wells 480, 408, 409, and other collinear scribe line wells is at least 70% of the scribe line 428. For example, the combined length of the scribe line wells 480, 408, 409, and other collinear scribe line wells is at least 80% of the scribe line 428. For example, the combined length of the scribe line wells 480, 408, 409, and other collinear scribe line wells is at least 90% of the scribe line 428. For example, the combined length of the scribe line wells 480, 408, 409, and other collinear scribe line wells is at least 95% of the scribe line 428.

Wires electrically couple bond pads 420 of the die 403 to bond fingers 416 in bond finger wells 404. Additionally, wires electrically couple bond pads 421 of the die 403 to bond fingers 417 in bond finger wells 407. Also, wires electrically couple bond pads 470 of the die 454 to bond fingers 466 in bond finger wells 462. Wires electrically couple bond pads 468 of the die 454 to bond fingers 464 in bond finger wells 460. Additionally, wires electrically couple bond pads 486 of the die 478 to bond fingers 484 in bond finger wells 485. Also, wires electrically couple bond pads 494 of the die 490 to bond fingers 492 in bond finger wells 496.

FIG. 5B shows the cross section side view 430 of the ceramic panel 401 along a cut line 5B from the top view 400 of the ceramic panel 401 shown in FIG. 5A. Features out of the plane of the cut line 5B are not shown for clarity. The bond finger well 407 and the bond finger well 460 are on a top surface 444 of the ceramic panel 401, the scribe line wells 409 and 411 are on the top surface 444 of the ceramic panel 401, and scribe line wells 436 and 437 are on a bottom surface 446 of the ceramic panel 401. The scribe line well 409 is opposite the scribe line well 436, and the scribe line well 411 is opposite the scribe line well 437. The scribe line 415 is along the scribe line well 409, a scribe line 440 is along the scribe line well 436, the scribe line 428 is along the scribe line well 411, and a scribe line 441 is along the scribe line well 437.

FIG. 6 shows a flow chart 500 of an example method of substrate processing. The flow chart 500 may show steps performed in the block 102 in FIG. 1 and in FIGS. 2A-F.

In a block 502, a doctor blade casts ceramic slurry onto a carrier, to produce ceramic green tape. The ceramic slurry contains ceramic material dissolved in a solvent, mixed with plasticizers and/or binders. The ceramic material may be alumina, zirconia, or another ceramic material. In other examples, a carrier is not used. The ceramic green tape may have a thickness between about 0.2 mm thick and about 0.3 mm thick. Heaters dry the ceramic green tape.

In a block 503, a green tape blanker slices the ceramic green tape from the block 502 into segments, to produce ceramic green sheets.

In a block 504, while the ceramic green sheets are green, a punching machine forms a pattern on the ceramic green sheets from the block 503, by punching the ceramic green sheets, to produce patterned ceramic sheets. Punching the ceramic green sheets includes punching scribe line wells, punching bond finger wells, punching alignment marks, punching alignment notches, punching interconnect features, punching vias, punching datum holes or notches, punching corner holes, and/or punching registration holes in the ceramic green sheets. In one example, all of the features are punched in a single punching step, for example using a single multi-pin punching tool. For example, the multi-pin punching tool simultaneously punches the scribe line wells and bond finger wells in a single punching step per ceramic green sheet. In another example, some of the punched features are punched in a first punching step per ceramic green sheet using a first multi-pin punching tool or a first single-pin punching tool and other of the punched features are punched in a second punching step per ceramic green sheet using a second multi-pin punching tool or a second single-pin punching tool. In an example, punching the ceramic green sheets includes punching, in a ceramic green sheet of the ceramic green sheets, a first scribe line well, a second scribe line well parallel the first scribe line well, a third scribe line well perpendicular to the first scribe line well, and a fourth scribe line well parallel to the third scribe line well. The parallel scribe lines may be approximately parallel, allowing for fabrication imperfections. Also, the perpendicular scribe lines may be approximately perpendicular, allowing for fabrication imperfections. The first scribe line well, the second scribe line well, the third scribe line well, and the fourth scribe line well form a frame pattern. In an example, a scribe line well is punched through a single ceramic green sheet. In another example, a scribe line well is punched through multiple ceramic green sheets, for example through two ceramic green sheets. In an example, the scribe line wells have widths between about 0.15 mm wide and about 0.05 mm wide.

In a block 506, a machine, for example a screen printer, prints metal onto the bond finger wells and the interconnect features from the block 504, to produce printed ceramic sheets. In an example, the metal is a tungsten based ink. In some examples, via filling is also performed in the block 506. In an example, metal is not printed onto the scribe line wells. In another example, a trace amount of metal is printed onto the scribe line wells.

In a block 508, a stacker stacks the printed ceramic sheets from the block 506 in a stack, to produce a ceramic panel. The stacker uses the registration holes to align the printed ceramic sheets. In some examples, the stacker removes the carriers before stacking the printed ceramic sheets. In other examples, the carrier is removed, for example burned off, in a subsequent step. In additional examples, a carrier is not used, and therefore is not removed. The ceramic panel has a top surface that is opposite the bottom surface. In an example, the ceramic panel has a thickness of between about 1.9 mm thick and about 2.2 mm thick. In some examples, the ceramic panel has a thickness of about 1.925 mm thick. In other examples, the ceramic panel has a thickness greater than 2 mm thick, for example about 2.1 mm thick or about 2.2 mm thick. In additional examples, the ceramic panel has a thickness greater than 2.2 mm thick. In one example, there are scribe line wells on both the top surface and the bottom surface of the ceramic panel. In an example, a first scribe line well on the top surface of the ceramic panel is opposite, for example directly opposite, a second scribe line well on the bottom surface of the ceramic panel. In other examples, there are scribe line wells only on the top surface of the ceramic panel, or only on the bottom surface of the ceramic panel. In an example, there are bond finger wells on the top surface of the ceramic panel. In an example, a scribe line well has a depth equal to a thickness of a printed ceramic sheet, for example between about 0.2 mm deep and about 0.3 mm deep. In another example, a scribe line well has a depth equal to the thickness of two printed ceramic sheets, and the scribe line well extends through two printed ceramic sheets, for example having a depth between about 0.4 mm deep and about 0.6 mm deep.

In a block 509, a machine laminates the ceramic panel from the block 508, to produce a laminated ceramic panel. The machine performs isostatic pressing on the ceramic panel. In an example, the scribe line wells span at least 40% of the length of the laminated ceramic panel. For example, the scribe line wells span at least 50% of the length of the laminated ceramic panel. For example, the scribe line wells span at least 60% of the length of the laminated ceramic panel. For example, the scribe line wells span at least 70% of the length of the laminated ceramic panel. For example, the scribe line wells span at least 80% of the length of the laminated ceramic panel. For example, the scribe line wells span at least 90% of the length of the laminated ceramic panel. For example, the scribe line wells span at least 95% of the length of the laminated ceramic panel.

In a block 510, a tool forms scribe lines along the scribe line wells of the laminated ceramic panel from the block 509, to produce a scribed ceramic panel. In an example, the tool is a straight blade that is pushed down into the ceramic material. In other examples, the tool may be a laser or a cutting tool, such as a saw or a diamond tip cutting tool. Scribe lines are formed in the top surface of the ceramic panel and/or in the bottom surface of the ceramic panel. In an example, scribe lines on the top surface of the ceramic panel are opposite the scribe lines on the bottom surface of the ceramic panel, for example offset by less than 0.05 mm. In an example, the tool forms a first scribe line along a first scribe line well on the top surface of the ceramic panel and forms a second scribe line along a second scribe line well on the bottom surface of the ceramic panel. In an example, a scribe line is formed along multiple collinear scribe line wells. In an example, at least 40% of the length of the scribe line is formed along the scribe line well. For example, at least 50% of the length of scribe line is formed along the length of the scribe line wells. For example, at least 60% of the length of the scribe line is formed along the length of the scribe line wells. For example, at least 70% of the length of the scribe line is formed along the length of the scribe line wells. For example, at least 80% of the length of the scribe line is formed along the length of the scribe line wells. For example, at least 90% of the length of the scribe line is formed along the length of the scribe line wells. For example, at least 95% of the length of the scribe line is formed alone the length of the scribe line wells. In an example, the scribe lines have depths between about 0.3 mm deep and about 0.88 mm deep, for example about 0.78 mm deep. In some examples, the scribe lines have depths greater than 0.88 mm deep. Forming the scribe lines along the scribe line wells reduces the risk of premature breakage during transportation and subsequent processing, while making the ceramic panel easy to singulate. In some examples, block 510 is not performed, and scribe lines are not formed along the scribe line wells.

In a block 512, an oven co-fires the scribed ceramic panel from the block 510, to produce a co-fired ceramic panel. The co-fired ceramic panel is no longer green. The co-firing may be low temperature co-firing, performed below about 1000 degrees Celsius, or high temperature co-firing, performed at about 1600 degrees Celsius. In some examples in which the carrier has not previously been removed, the carrier burns off during co-firing.

In a block 514, a machine applies a plating layer to the bond fingers and contacts of the co-fired ceramic panel from the block 512, to produce a plated ceramic panel. The machine may be a sputtering machine, an electroless plating machine, or an electroplating machine. In one example, the machine initially applies a layer of nickel to the exposed metal, for example the bond fingers and contacts. Then, either the same machine or a different machine applies a layer of gold over the layer of nickel.

FIG. 7 shows a flow chart 600 of an example method of packaging. FIG. 7 may show the steps performed in the blocks 104 and 106 of the FIG. 1 or shown in FIGS. 2F-K. In a block 602, a system obtains a ceramic panel having scribe lines along scribe line wells. In an example, the ceramic panel is the co-fired ceramic panel from the block 514 in FIG. 6. In an example, a scribe line is along multiple collinear scribe line wells with gaps between the multiple collinear scribe line wells. In an example, the ceramic panel has a first scribe line well on a top surface of the ceramic panel and a second scribe line well on a bottom surface of the ceramic panel, opposite the first scribe line well. The ceramic panel may have a first scribe line along the first scribe line well on the top surface of the ceramic panel and a second scribe line along the second scribe line well on the bottom surface of the ceramic panel, opposite the first scribe line well. In other examples, the ceramic panel only has scribe line wells on the top surface of the ceramic panel or only on the bottom surface of the ceramic panel. In an example, the top surface of the ceramic panel and/or the bottom surface of the ceramic panel has a first scribe line well, a second scribe line well parallel to the first scribe line well, a third scribe line well perpendicular to the first scribe line well, and a fourth scribe line well parallel to the third scribe line well, where the first scribe line well, the second scribe line well, the third scribe line well, and the fourth scribe line well are in a frame pattern. In an example, the ceramic panel has multiple frame patterns of multiple scribe line wells. Also, the ceramic panel may have bond finger wells and/or bond fingers on the top surface of the ceramic panel. The ceramic panel may have additional features, such as interconnect features. The ceramic panel may have a thickness between about 1.9 mm thick and about 2.2 mm thick. In an example, the ceramic panel has a thickness of at least 1.925 mm thick. In other examples, the ceramic panel is even thicker, for example about 2.1 mm thick or about 2.2 mm thick. In an example, the scribe line wells have depths between about 0.2 mm deep and about 0.3 mm deep.

In a block 604, a tool attaches a connector to the bottom surface of the ceramic panel obtained in the block 602, to produce a connector ceramic panel. In an example, a connector is attached within the frame pattern of the scribe line wells. In some examples, for example when there are LGA pads on the bottom surface of the ceramic panel, the block 604 is not performed.

In a block 606, a tool attaches die to the top surface of the ceramic panel from the block 602, or to the connector ceramic panel from the block 604, to produce a die ceramic panel. The tool uses epoxy to attach the die to the ceramic panel. In an example, the die is attached within the frame pattern of the scribe line wells. In one example, the die is attached to the same side of the ceramic panel as the scribe line wells. In another example, the die is attached to the opposite side of the ceramic panel to the scribe line wells. In an additional example, the scribe line wells are on both sides of the ceramic panel. In an example, the die contains SLMs, such as DMDs.

In a block 608, a tool wire bonds the die attached in the block 606 to the bond fingers on the die ceramic panel, to produce a bonded ceramic panel. The tool may perform ball bonding, wedge bonding, or compliant bonding. The wires may contain aluminum, copper, silver, and/or gold.

In a block 610, a tool applies glob top over the wires of the bonded ceramic panel from the block 608, to produce an encapsulated ceramic panel. In one example, the glob top is a hemispherical glob top. In another example, the glob top is a two material dam-and-fill glob top. In some examples, block 610 is not performed, and glob top is not applied.

In a block 612, an oven bakes the encapsulated ceramic panel from the block 610, to produce a baked ceramic panel.

In a block 614, a tool singulates the baked ceramic panel from the block 612 along the scribe lines along the scribe line wells, to form packaged devices or individual substrates. A fixture holds the ceramic panel in place, with one row of die overhanging an edge of the fixture. Another tool is used to hold the row and push down on the row, until the row breaks away from the rest of the ceramic panel. Another fixture holds each row, while another tool breaks away the individual die. In an example, the ceramic panel has first scribe lines along scribe line wells on the top surface of the ceramic panel and/or second scribe lines along scribe line wells on the bottom surface of the ceramic panel, and the tool breaks the ceramic panel along the first scribe lines and/or the second scribe lines. In an example, the first scribe lines are opposite the second scribe lines. The scribe line wells help the ceramic panel singulates cleanly, without singulation burrs, singulation cracks, or device failure.

Although the example illustrative arrangements have been described in detail, it should be understood that various changes, substitutions and alterations can be made herein without departing from the spirit and scope of the present application as defined by the appended claims.

Moreover, the scope of the present application is not intended to be limited to the particular illustrative example arrangement of the process, machine, manufacture, and composition of matter means, methods and steps described in this specification. As one of ordinary skill in the art will readily appreciate from the disclosure, processes, machines, manufacture, compositions of matter, means, methods or steps, presently existing or later to be developed, that perform substantially the same function or achieve substantially the same result as the corresponding example arrangements described herein may be utilized according to the illustrative arrangements presented and alternative arrangements described, suggested or disclosed. Accordingly, the appended claims are intended to include within their scope such processes, machines, manufacture, compositions of matter, means, methods, or steps.

What is claimed is:

1. A method of manufacturing an electronic device, the method comprising:
   forming respective patterns on ceramic sheets to produce patterned ceramic sheets;
   arranging the patterned ceramic sheets to produce a ceramic panel, the ceramic panel having scribe line wells, bond fingers, and contacts;
   forming scribe lines along the scribe line wells of the ceramic panel; and
   applying a plating layer to the bond fingers and the contacts of the ceramic panel.

2. The method of claim 1, further comprising:
   printing metal onto bond finger wells and interconnect features of the patterned sheets.

3. The method of claim 2, wherein the scribe line wells do not contain metal.

4. The method of claim 2, wherein the scribe line wells are first scribe line wells on a first side of the ceramic panel, the ceramic panel further comprising second scribe line wells on a second side of the ceramic panel.

5. The method of claim 1, further comprising co-firing the ceramic panel.

6. The method of claim 1, wherein the ceramic panel has a thickness of at least 1.9 mm.

7. A method of manufacturing an electronic device, the method comprising:
   obtaining a ceramic panel having scribe lines along first scribe line wells on a first side of the ceramic panel, the ceramic panel having second scribe line wells on a second side of the ceramic panel;
   attaching a die to the ceramic panel, after obtaining the ceramic panel having the scribe lines along the first scribe line wells; and
   singulating the ceramic panel along the scribe lines along the first scribe line wells.

8. The method of claim 7, further comprising:
   wire bonding the die to bond fingers of the ceramic panel; and
   encapsulating the ceramic panel.

9. The method of claim 7, further comprising baking the ceramic panel.

10. The method of claim 7, wherein the ceramic panel has a thickness of at least 1.9 mm.

11. The method of claim 7, wherein the first scribe line wells do not contain metal.

12. A method comprising:
   obtaining a ceramic panel, the ceramic panel having scribe line wells, bond fingers, and contacts;
   forming scribe lines along the scribe line wells of the ceramic panel, the scribe lines having angled sidewalls; and
   applying a plating layer to the bond fingers and the contacts of the ceramic panel, to produce a plated ceramic panel.

13. The method of claim 12, further comprising:
   forming respective patterns on ceramic sheets; and
   arranging the patterned ceramic sheets to produce the ceramic panel.

14. The method of claim 13, further comprising printing metal onto bond finger wells and interconnect features of the patterned ceramic sheets.

15. The method of claim 12, further comprising co-firing the ceramic panel.

16. The method of claim 12, wherein the ceramic panel has a thickness of at least 1.9 mm.

17. The method of claim 12, wherein the scribe line wells do not contain metal.

18. The method of claim 12, wherein the scribe line wells are first scribe line wells on a first side of the ceramic panel, the ceramic panel further comprising second scribe line wells on a second side of the ceramic panel.

* * * * *